(12) United States Patent
Orihashi et al.

(10) Patent No.: US 10,090,152 B2
(45) Date of Patent: Oct. 2, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yugo Orihashi, Toyama (JP); Atsushi Moriya, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/415,032

(22) Filed: Jan. 25, 2017

(65) Prior Publication Data

US 2017/0221699 A1    Aug. 3, 2017

(30) Foreign Application Priority Data

Jan. 29, 2016    (JP) .................................. 2016-016418

(51) Int. Cl.
*H01L 21/02*    (2006.01)
*C23C 16/52*    (2006.01)
(Continued)

(52) U.S. Cl.
CPC ........ *H01L 21/0257* (2013.01); *C23C 16/045* (2013.01); *C23C 16/24* (2013.01); *C23C 16/45531* (2013.01); *C23C 16/45544* (2013.01); *C23C 16/45553* (2013.01); *H01L 21/0245* (2013.01); *H01L 21/0262* (2013.01);
(Continued)

(58) Field of Classification Search
CPC . C23C 16/045; C23C 16/45531; C23C 16/52; C23C 16/455; H01L 21/02639; H01L 21/0245; H01L 21/02576; H01L 27/10847; H01L 27/10823; H01L 27/10814; H01L 21/67248; H01L 29/167; H01L 21/0262; H01L 1/0228; H01L 21/02532
See application file for complete search history.

(56) References Cited

U.S. PATENT DOCUMENTS 9,190,298 B2 *  11/2015  Harada ............. H01L 21/67017
9,412,587 B2 *   8/2016  Moriya ............. H01L 21/02598
(Continued)

FOREIGN PATENT DOCUMENTS

JP    2013-197307 A    9/2013
JP    2014-060227 A    4/2014
(Continued)

OTHER PUBLICATIONS

Korean Office Action dated Jul. 19, 2018 for the Korean Patent Application No. 10-2017-0012943.

*Primary Examiner* — Savitr Mulpuri
(74) *Attorney, Agent, or Firm* — Volpe and Koenig, P.C.

(57) ABSTRACT

There is provided a method of manufacturing a semiconductor device, which includes: forming a seed layer doped with a dopant on a substrate by performing a cycle a predetermined number of times, the cycle including: supplying a halogen-based first process gas to the substrate, supplying a non-halogen-based second process gas to the substrate, and supplying a dopant gas to the substrate; and supplying a third process gas to the substrate to form a film on the seed layer.

9 Claims, 12 Drawing Sheets

(51) Int. Cl.

| | | |
|---|---|---|
| *C23C 16/455* | (2006.01) | |
| *H01L 21/67* | (2006.01) | |
| *H01L 27/108* | (2006.01) | |
| *H01L 27/11582* | (2017.01) | |
| *H01L 29/167* | (2006.01) | |
| *C23C 16/04* | (2006.01) | |
| *C23C 16/24* | (2006.01) | |

(52) U.S. Cl.
CPC .. *H01L 21/02532* (2013.01); *H01L 21/02576* (2013.01); *H01L 21/02579* (2013.01); *H01L 21/02639* (2013.01); *H01L 21/67248* (2013.01); *H01L 27/10814* (2013.01); *H01L 27/10823* (2013.01); *H01L 27/10847* (2013.01); *H01L 27/11582* (2013.01); *H01L 29/167* (2013.01); *C23C 16/52* (2013.01)

(56) References Cited

U.S. PATENT DOCUMENTS

| | | | | |
|---|---|---|---|---|
| 9,691,609 | B2 * | 6/2017 | Moriya | H01L 21/02598 |
| 2004/0224475 | A1 * | 11/2004 | Lee | C23C 16/0281 |
| | | | | 438/399 |
| 2011/0065289 | A1 * | 3/2011 | Asai | C23C 16/345 |
| | | | | 438/791 |
| 2012/0178264 | A1 * | 7/2012 | Murakami | C23C 16/345 |
| | | | | 438/765 |
| 2013/0023110 | A1 * | 1/2013 | Kakimoto | H01L 21/0245 |
| | | | | 438/482 |
| 2013/0149846 | A1 | 6/2013 | Koshi et al. | |
| 2013/0237064 | A1 * | 9/2013 | Kirikihira | H01L 21/67109 |
| | | | | 438/758 |
| 2013/0337660 | A1 * | 12/2013 | Ota | C23C 16/308 |
| | | | | 438/786 |
| 2013/0344689 | A1 * | 12/2013 | Moriya | H01L 21/02667 |
| | | | | 438/486 |
| 2014/0080321 | A1 | 3/2014 | Hirose et al. | |
| 2014/0179085 | A1 | 6/2014 | Hirose et al. | |
| 2014/0256156 | A1 * | 9/2014 | Harada | H01L 21/67017 |
| | | | | 438/778 |
| 2016/0013042 | A1 | 1/2016 | Hashimoto et al. | |
| 2016/0141173 | A1 * | 5/2016 | Moriya | H01L 21/02598 |
| | | | | 438/479 |
| 2017/0186604 | A1 * | 6/2017 | Orihashi | C23C 16/455 |
| 2017/0263441 | A1 * | 9/2017 | Orihashi | C23C 16/24 |

FOREIGN PATENT DOCUMENTS

| | | |
|---|---|---|
| JP | 2014-067796 A | 4/2014 |
| KR | 20140082922 A | 7/2014 |
| KR | 20160006631 A | 1/2016 |
| WO | 2012/029661 A1 | 3/2012 |

\* cited by examiner

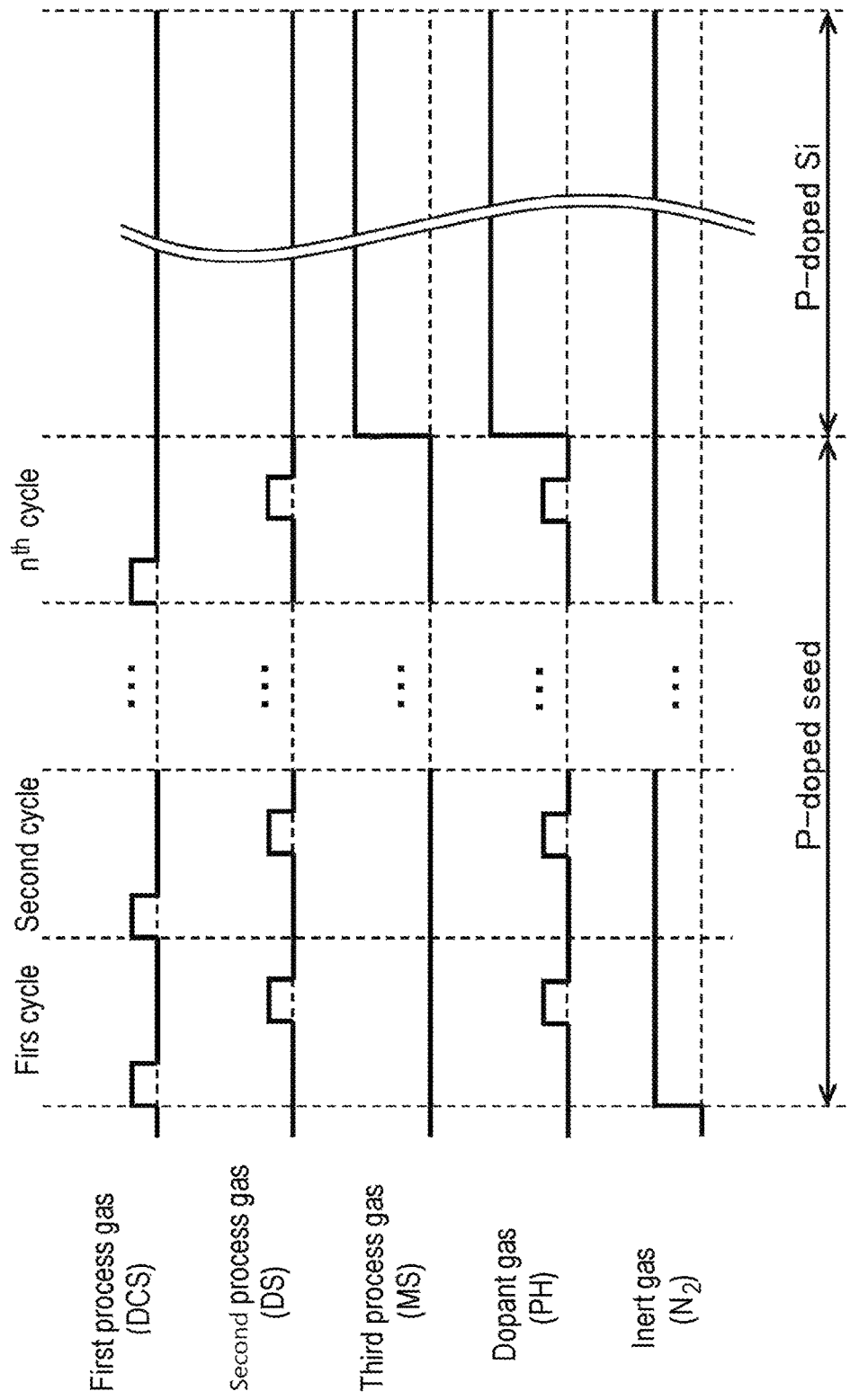

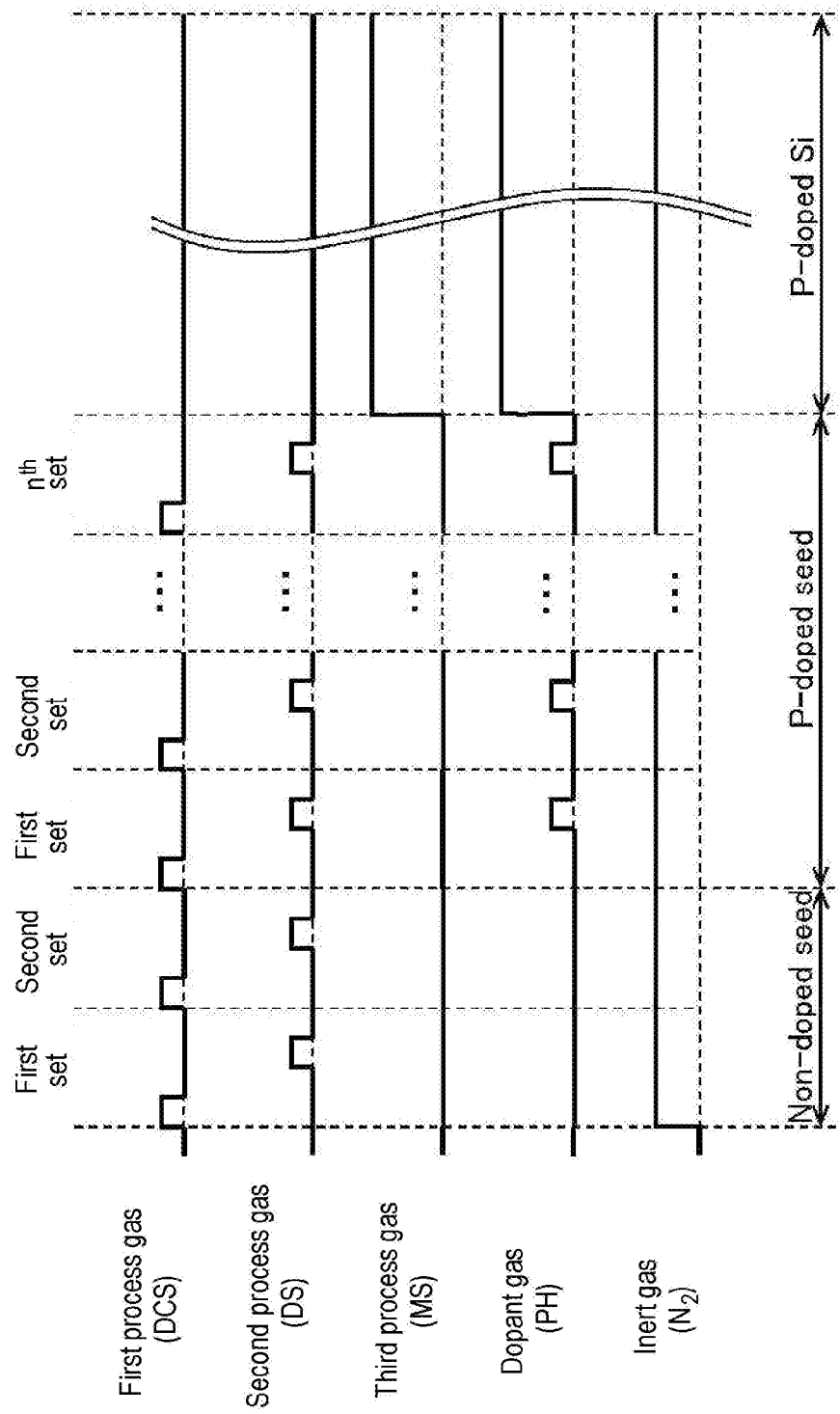

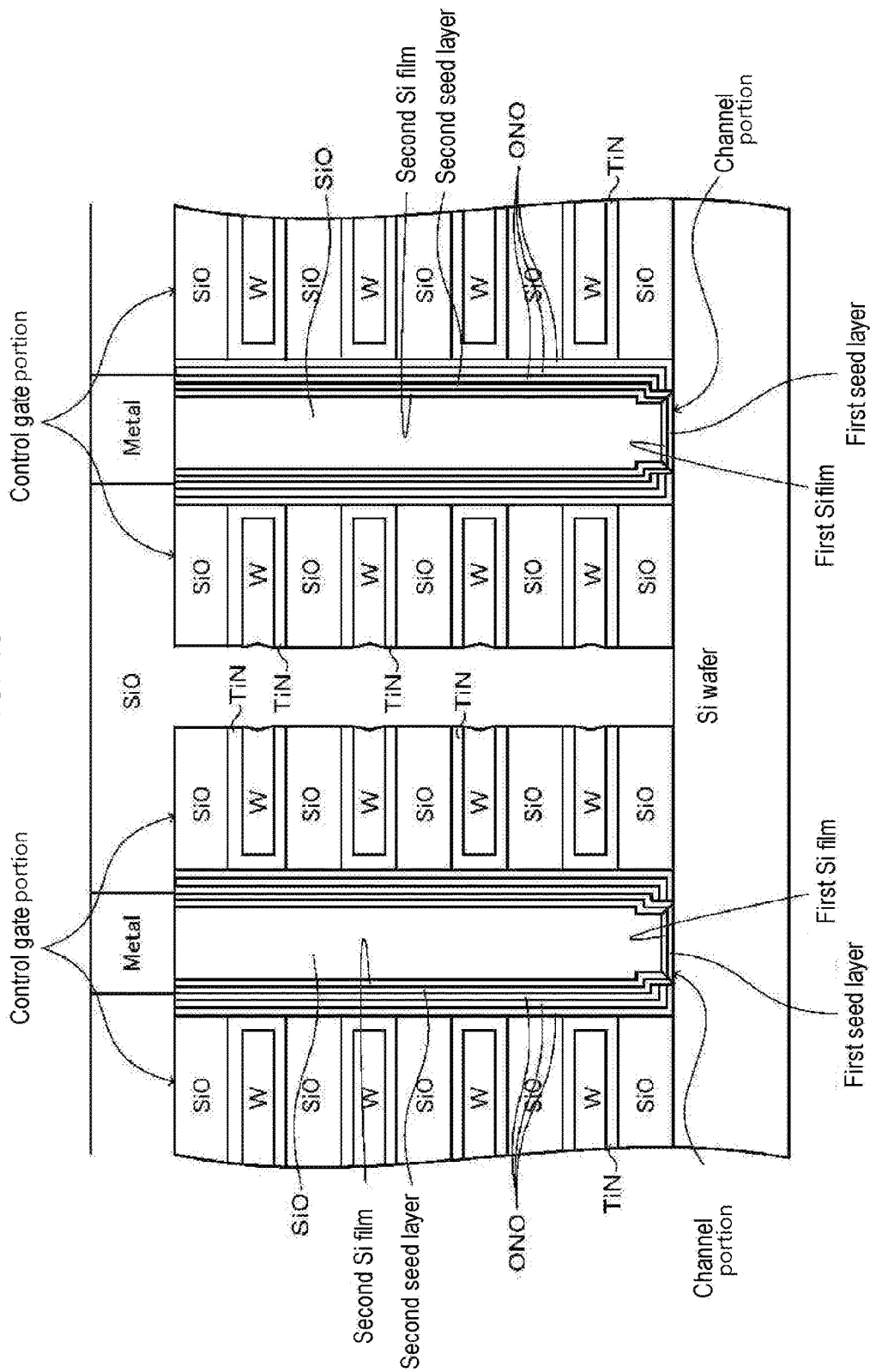

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2016-016418, filed on Jan. 29, 2016, the entire contents of which are incorporated herein by reference.

TECHNICAL FIELD

The present disclosure relates to a method of manufacturing a semiconductor device, a substrate processing apparatus, and a non-transitory computer-readable recording medium.

BACKGROUND

As one of many processes for manufacturing a semiconductor device, a film forming process of forming a film containing a predetermined element such as a silicon (Si) or the like as a main element on a substrate using a halogen-based process gas or a non-halogen-based process gas is often carried out.

SUMMARY

The present disclosure provides some embodiments of a technique capable of improving a quality of a film formed on a substrate.

According to one embodiment of the present disclosure, there is provided a method of manufacturing a semiconductor device, including: forming a seed layer doped with a dopant on a substrate by performing a cycle a predetermined number of times, the cycle including: supplying a halogen-based first process gas to the substrate, supplying a non-halogen-based second process gas to the substrate, and supplying a dopant gas to the substrate; and supplying a third process gas to the substrate to form a film on the seed layer.

BRIEF DESCRIPTION OF THE DRAWINGS

FIG. 4 is a view illustrating a film forming sequence according to one embodiment of the present disclosure.

FIG. 5 is a view illustrating a modification of the film forming sequence according to one embodiment of the present disclosure.

FIG. 10 is a view illustrating a cross-sectional structure of a major part of a 3DNAND.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
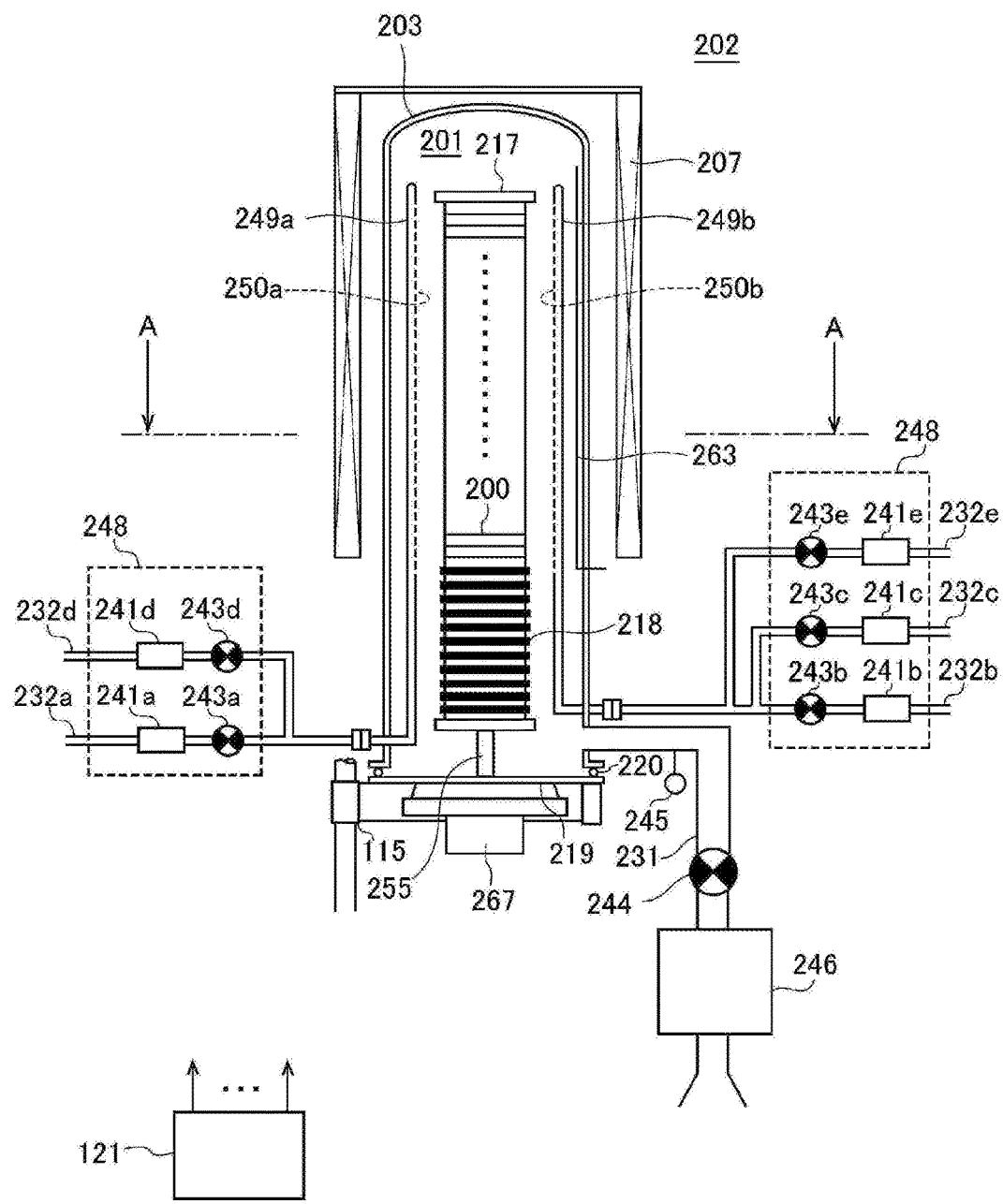
FIG. 1 is a schematic configuration view of a vertical type processing furnace of a substrate processing apparatus suitably used in one embodiment of the present disclosure, in which a portion of the processing furnace is shown in a vertical cross-sectional view.
Figure 2:
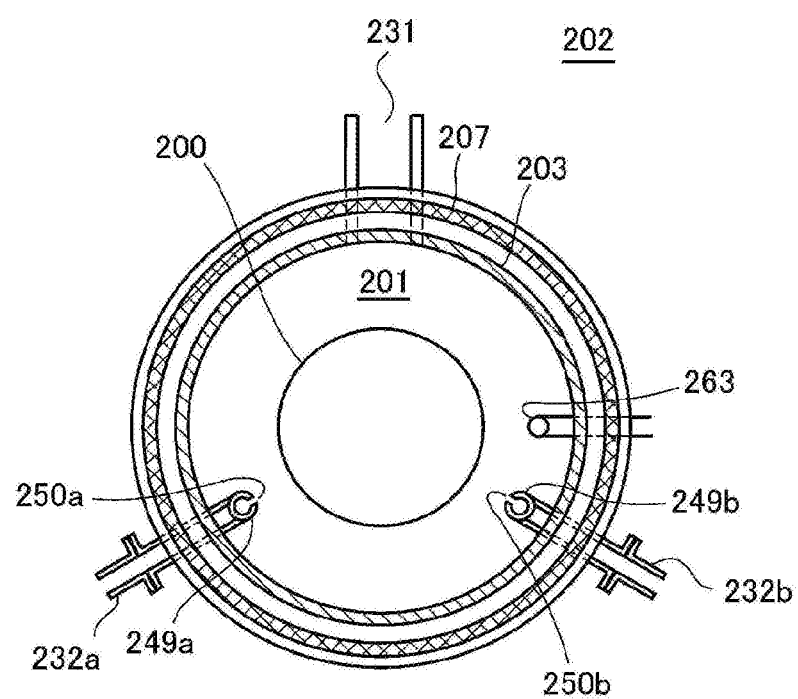
FIG. 2 is a schematic configuration view of the vertical type processing furnace of the substrate processing apparatus suitably used in one embodiment of the present disclosure, in which a portion of the processing furnace is shown in a cross-sectional view taken along line A-A in FIG. 1.

As illustrated in FIG. 1, a processing furnace 202 includes a heater 207 as a heating means (heating mechanism). The heater 207 has a cylindrical shape and is supported by a holding plate so as to be vertically installed. The heater 207 functions as an activation mechanism (an excitation part) configured to thermally activate (excite) a gas.

A reaction tube 203 constituting a reaction vessel (process vessel) is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed inside the process chamber 201 so as to penetrate through a sidewall of a lower portion of the reaction tube 203. The nozzles 249a and 249b are made of a heat resistant material such as, e.g., quartz, SiC or the like. Gas supply pipes 232a and 232b are respectively connected to the nozzles 249a and 249b. A gas supply pipe 232c is connected to the gas supply pipe 232b.

Mass flow controllers (MFCs) 241a to 241c as flow rate controllers (flow rate control parts), and valves 243a to 243c as opening/closing valves, are installed in the gas supply pipes 232a to 232c sequentially from respective upstream directions. Gas supply pipes 232d and 232e, which supply an inert gas, are respectively connected to the gas supply pipes 232a and 232b at the downstream side of the valves 243a and 243b. MFCs 241d and 241e and valves 243d and 243e are respectively installed in the gas supply pipes 232d and 232e sequentially from respective upstream directions.

The nozzles 249a and 249b are respectively connected to a front end portion of the gas supply pipes 232a and 232b. As illustrated in FIG. 2, the nozzles 249a and 249b are disposed in a circular ring-shaped space in a plan view between the inner wall of the reaction tube 203 and the wafers 200 such that the nozzles 249a and 249b are respectively installed to extend upward along an arrangement direction of the wafers 200 from a lower portion of the inner wall of the reaction tube 203 to an upper portion of the inner wall of the reaction tube 203. Specifically, the nozzles 249a and 249b are respectively installed at a lateral side of a wafer arrangement region in which the wafers 200 are arranged, namely in a region which horizontally surrounds the wafer arrangement region, so as to extend along the wafer arrangement region. Each of the nozzles 249a and 249b is configured as an L-shaped long nozzle. Gas supply holes 250a and 250b through which a gas is supplied, are respectively formed in lateral surfaces of the nozzles 249a and 249b. Each of the gas supply holes 250a and 250b is opened toward the center of the reaction tube 203 so as to allow a gas to be supplied toward the wafers 200. The gas supply holes 250a and 250b may be formed in plural places to span from the lower portion of the reaction tube 203 to the upper portion of the reaction tube 203. The respective gas supply holes 250a and 250b may have the same aperture area and may be formed at the same aperture pitch.

As described above, in the present embodiment, a gas is transferred through the nozzles 249a and 249b, which are disposed in a lengthwise long space of a circular ring shape in a plan view, i.e., a cylindrical space, defined by the inner wall of the sidewall of the reaction tube 203 and the end portions (peripheral portions) of the plurality of wafers 200 arranged within the reaction tube 203. The gas is initially injected into the reaction tube 203, near the wafers 200, through the gas supply holes 250a and 250b respectively formed in the nozzles 249a and 249b. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. In addition, the gas flowing on the surfaces of the wafers 200 flows toward an exhaust port, i.e., an exhaust pipe 231 which will be described later. However, the flow direction of the gas is not limited to a vertical direction but may be appropriately decided depending on a position of the exhaust port.

As a halogen-based first process gas, a gas which contains silicon (Si) as a predetermined element (main element) and a halogen element, i.e., a halosilane precursor gas, is supplied from the gas supply pipe 232a into the process chamber 201 through the MFC 241a, the valve 243a, and the nozzle 249a.

The precursor gas refers to a gaseous precursor, for example, a gas obtained by vaporizing a precursor which remains in a liquid state under room temperature and atmospheric pressure, or a precursor which remains in a gaseous state under room temperature and atmospheric pressure. The halosilane precursor refers to a precursor having a halogen group. The halogen group includes a chloro group, a fluoro group, a bromo group, an iodine group, and the like. That is to say, the halogen group includes a halogen element such as chlorine (Cl), fluorine (F), bromine (Br), iodine (I) or the like. When the term "precursor" is used herein, it may refer to "a precursor staying in a liquid state," "a precursor (precursor gas) staying in a gaseous state", or both.

As the first process gas, it may be possible to use a halosilane precursor gas which contains, for example, Si and Cl, i.e., a chlorosilane precursor gas which contains chlorosilane (chloride compound of Si). As the chlorosilane precursor gas, it may be possible to use, for example, a dichlorosilane ($SiH_2Cl_2$, abbreviation: DCS) gas.

Furthermore, as a dopant gas, a gas which contains an impurity (dopant) added (doped) to a layer or a film as formed is supplied from the gas supply pipe 232a into the process chamber 201 through the MFC 241a, the valve 243a, and the nozzle 249a. As the dopant gas, it may be possible to use a gas containing one of a chemical element of III group and a chemical element of V group, for example, a phosphine ($PH_3$, abbreviation: PH) gas.

As a non-halogen-based second process gas, a silane precursor gas which contains Si as a predetermined element (main element) and does not contain a halogen element is supplied from the gas supply pipe 232b into the process chamber 201 through the MFC 241b, the valve 243b, and the nozzle 249b. As the second process gas, it may be possible to use a silicon hydride precursor gas which contains silicon hydride (hydrogen compound of Si), for example, a disilane ($Si_2H_6$, abbreviation: DS) gas.

As a third process gas, a silane precursor gas which contains Si as a predetermined element (main element) and does not contain a halogen element is supplied from the gas supply pipe 232c into the process chamber 201 through the MFC 241c, the valve 243c, the gas supply pipe 232b, and the nozzle 249b. As the third process gas, it may be possible to use a silicon hydride precursor gas which contains silicon hydride, for example, a monosilane ($SiH_4$, abbreviation: MS) gas.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b, respectively.

A first supply system for supplying the first process gas is mainly configured by the gas supply pipe 232a, the MFC 241a, and the valve 243a. The first supply system may be referred to as a first precursor (gas) supply system. A second supply system for supplying the second process gas is mainly configured by the gas supply pipe 232b, the MFC 241b, and the valve 243b. The second supply system may be referred to as a second precursor (gas) supply system. A third supply system for supplying the third process gas is mainly configured by the gas supply pipe 232c, the MFC 241c, and the valve 243c. The third supply system may be referred to as a third precursor (gas) supply system. A fourth supply system for supplying the dopant gas is mainly configured by the gas supply pipe 232a, the MFC 241a, and the valve 243a. The fourth supply system may be referred to as a dopant (gas) supply system.

One or all of the first to third supply systems may be referred to as a process gas supply system or a film forming gas supply system. The fourth supply system may be regarded as being included in the film forming gas supply system.

Furthermore, an inert gas supply system is mainly configured by the gas supply pipes 232d and 232e, the MFCs 241d and 241e, and the valves 243d and 243e. The inert gas supply system may be referred to as a purge gas supply system, a dilution gas supply system or a carrier gas supply system.

One or all of the various supply systems described above may be configured as an integrated gas supply system 248 defined by integrating the valves 243a to 243e, the MFCs 241a to 241e and the like. The integrated gas supply system 248 is connected to each of the gas supply pipes 232a to 232e and is configured such that the supply operation of various kinds of gases to the gas supply pipes 232a to 232e, i.e., the opening/closing operation of the valves 243a to 243e, the flow rate adjusting operation performed by the MFCs 241a to 241e and the like are controlled by the controller 121 which will be described later. The integrated gas supply system 248 is configured as an integral type or division type integrated unit and may be attached to or detached from the gas supply pipes 232a to 232e and the like on an integrated unit basis so that the maintenance, exchange, expansion and the like of the gas supply systems may be implemented on an integrated unit basis.

An exhaust pipe 231 configured to exhaust an internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects an internal pressure of the process chamber 201 and an auto pressure controller (APC) valve 244 as a pressure regulator (pressure regulation part). In a state where the vacuum pump 246 is being operated, the APC valve 244 opens or closes the APC valve 243 to vacuum-exhaust the interior of the process chamber 201 or stop the vacuum-exhaust. Further, in a state where the vacuum pump 246 is being operated, the APC valve 244 adjusts an opening degree of the APC valve 243 based on the pressure information detected by the pressure sensor 245, thus adjusting the internal pressure of the process chamber 201. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of metal such as, e.g., stainless steel or the like, and is formed in a disc shape. An O-ring 220, which is a seal member making contact with the lower end of the reaction tube 203, is installed on an upper surface of the seal cap 219. A rotation mechanism 267 configured to rotate a boat 217, which will be described later, is installed below the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube. 203. The boat elevator 115 is configured to load and unload the boat 217 into and from the process chamber 201 by moving the seal cap 219 up and down. That is to say, the boat elevator 115 is configured as a transfer device (transfer mechanism) which transfers the boat 217, i.e., the wafers 200, into and out of the process chamber 201.

The boat 217 serving as a substrate support is configured to support a plurality of, e.g., 25 to 200 wafers 200 in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for heat generated from the heater 207 to be radiated to the seal cap 219.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
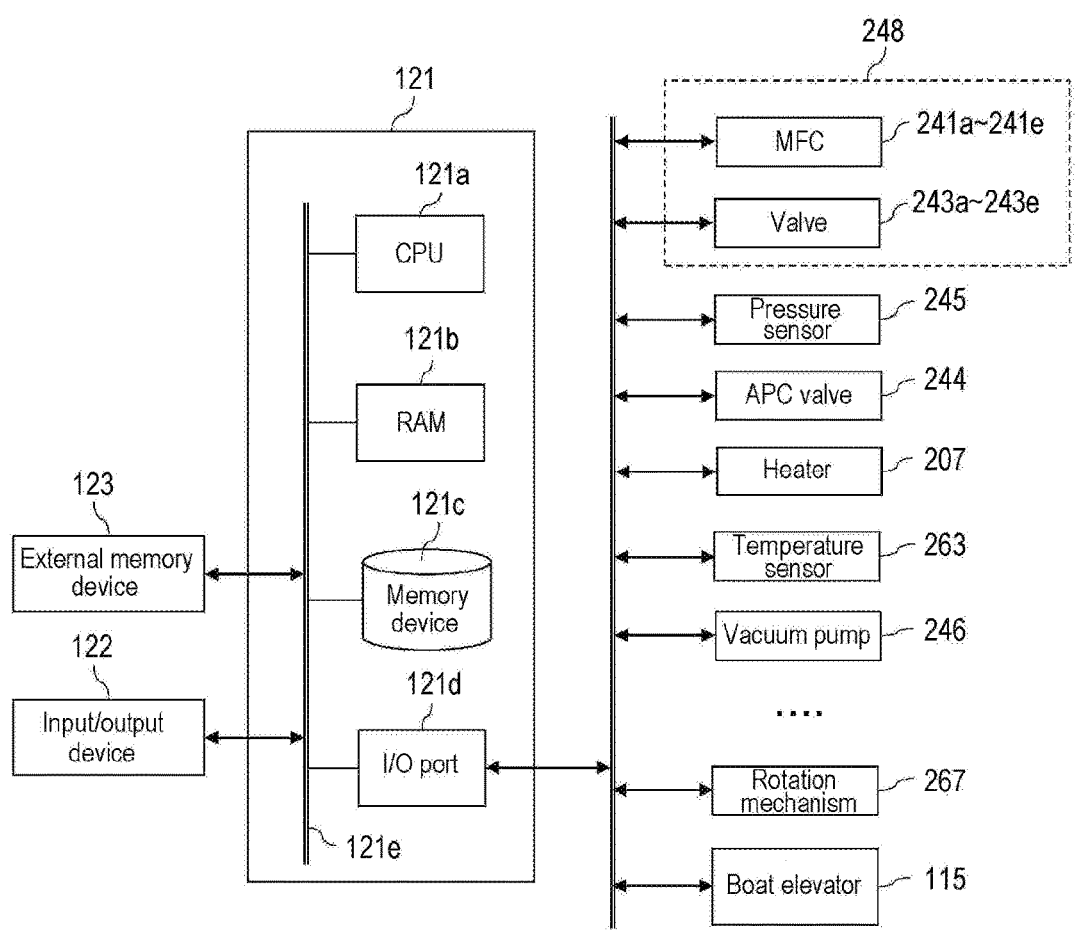
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 configured of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying procedures and conditions of a substrate process (to be described later), or the like is readably stored in the memory device 121c. The process recipe functions as a program for causing the controller 121 to execute each sequence in the substrate process (to be described later), to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, and the like.

The CPU 121a is configured to read and execute the control program from the memory device 121c. The CPU 121a is also configured to read the process recipe from the memory device 121c according to an operation command inputted from the input/output device 122. In addition, the CPU 121a is configured to control, according to the contents of the recipe thus read, the flow rate adjusting operation of various kinds of gases performed by the MFCs 241a to 241e, the opening/closing operation of the valves 243a to 243e, the opening/closing operation of the APC valve 244, the pressure regulating operation performed by the APC valve 244 through the pressure sensor 245, the start and stop operations of the vacuum pump 246, the temperature adjusting operation of the heater 207 based on the temperature sensor 263, the rotation and adjustment of the rotation speed of the boat 217 performed by the rotation mechanism 267, an elevation operation of the boat 217 performed by the boat elevator 115, and the like.

The controller 121 may be configured by installing, on the computer, the aforementioned program stored in an external memory device 123 (for example, a magnetic disc such as a hard disk, an optical disc such as a CD or DVD, a magnetooptical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided to the computer using a communication means such as the Internet or a dedicated line, instead of using the external memory device 123.

(2) Substrate Processing Process

A sequence example of forming an Si film on a substrate using the aforementioned substrate processing apparatus, which is one of the processes for manufacturing a semiconductor device, will be described with reference to FIG. 4 and FIGS. 6A to 6G. In the following descriptions, the operations of the respective parts constituting the substrate processing apparatus are controlled by the controller 121.

In a film forming sequence illustrated in FIG. 4, there are performed: a step (seed step) of forming a seed layer (doped seed layer) doped with P as a dopant on a wafer 200 by performing a cycle a predetermined number of times (n times), the cycle including: a step of supplying a DCS gas as a first process gas to the wafer 200 as a substrate, a step of supplying a DS gas as a second process gas to the wafer 200, and a step of supplying a PH gas as a dopant gas to the wafer 200; and a step (CVD-based film forming step) of supplying an MS gas as a third process gas to the wafer 200 to form an Si-containing film, i.e., an Si film, on the seed layer.

Furthermore, in the film forming sequence illustrated in FIG. 4, there is shown an example in which the seed step includes a period during which the step of supplying the DS gas and the step of supplying the PH gas are simultaneously performed. In addition, in the film forming sequence, there is shown an example in which the CVD-based film forming step includes the step of supplying the PH gas to the wafer 200. In the CVD-based film forming step, the P-doped Si film as a dopant is formed on the seed layer. In the following descriptions, the seed layer doped with P may be simply referred to as a seed layer. Also, the Si film doped with P may be simply referred to as an Si film.

In addition, in the film forming sequence illustrated in FIG. 4, the seed step and the CVD-based film forming step described above are performed with respect to the wafer 200 on which a single crystal Si and an insulating film are formed. Thus, a first Si film undergoes a homo-epitaxial growth on the single crystal Si and a second Si film having a crystal structure different from that of the first Si film is grown on the insulating film. That is to say, in the film forming sequence illustrated in FIG. 4, there is formed a laminate structure (laminated film) obtained by forming the first Si film followed by the second Si film on the single crystal Si using three kinds of silane precursor gases (triple Si source). In the present embodiment, a film having such a laminate structure may sometimes be simply referred to as an Si film.

Thereafter, in the present embodiment, a step (annealing step) of homo-epitaxializing a portion of the second Si film making contact with the first Si film (homo-epitaxial Si film) is performed by heat-treating (annealing) the Si film having the laminate structure as described above.

In the present disclosure, for the sake of convenience, a series of sequences described above may be expressed as follows. Furthermore, in the present disclosure, the seed step described above may be referred to as a "parallel seed step" and the annealing step described above may be referred to as "ANL".

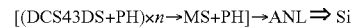

[(DCS43DS+PH)×$n$→MS+PH]→ANL ⇒ Si

When the term "wafer" is used herein, it may refer to "a wafer itself" or "a laminated body (aggregate) of a wafer and a predetermined layer or film formed on the surface of the wafer". That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

A plurality of wafers 200 is charged in the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220b.

As the wafer 200, for example, it may be possible to use an Si substrate formed of single crystal Si or a substrate having a single crystal Si film formed on its surface. An insulating film 200a such as, for example, a silicon oxide film (SiO$_2$ film, hereinafter, also referred to as an SiO film) or the like is formed in advance in a portion of the surface of the wafer 200. That is to say, the single crystal Si and the insulating film 200a remain exposed on the surface of the wafer 200. The insulating film 200a may be a silicon nitride film (SiN film), a silicon oxynitride film (SiON film) or the like, in addition to the SiO film.

Figure 6A:
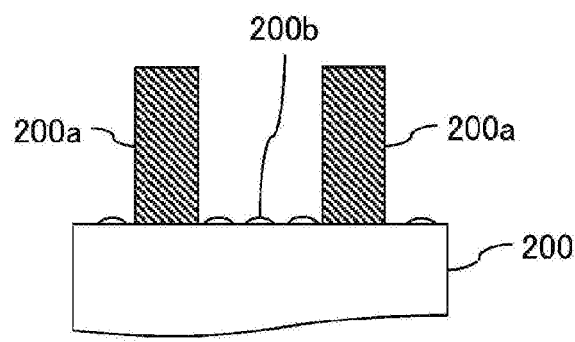
FIG. 6A is a view illustrating a cross-sectional structure of a wafer surface before a seed step starts.
Figure 6B:
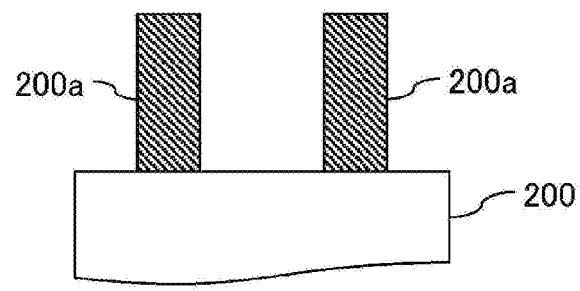
FIG. 6B is a view illustrating a cross-sectional structure of a wafer surface after a DCS gas is supplied in the course of the seed step.

FIGS. 6A to 6G illustrate a case of processing the wafer 200 in which a concave portion is formed in the surface of the wafer 200, a bottom portion of the concave portion is formed of single crystal Si, and a side portion and an upper portion of the concave portion are formed of the insulating film (SiO film) 200a. FIGS. 6A to 6G are views obtained by partially enlarging a cross-sectional structure of the surface of the wafer 200 for the sake of convenience. Before the wafer 200 is loaded into the process chamber 201, the surface of the wafer 200 is cleaned in advance by a hydrogen fluoride (HF) or the like. However, the surface of the wafer 200 is temporarily exposed to atmosphere until the wafer 200 is loaded into the process chamber 201 after the cleaning process. Thus, as illustrated in FIG. 6A, a natural oxide film (SiO film) 200b is formed in at least a portion of the surface of the wafer 200 loaded into the process chamber 201. The natural oxide film 200b may be formed to sparsely (in an island shape) cover the bottom portion of the concave portion, namely a portion of the exposed single crystal Si, or to continuously (in a non-island shape) cover the entire area of the exposed single crystal Si.

(Pressure Regulation and Temperature Adjustment)

The interior of the process chamber 201, namely the space in which the wafers 200 are located, is vacuum-exhausted (depressurization-exhausted) by the vacuum pump 246 so as to have a desired pressure (degree of vacuum). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Seed Step)

Thereafter, the following two steps, i.e., steps 1 and 2, are sequentially performed.

[Step 1]

At this step, a DCS gas is supplied to the wafer 200 in the process chamber 201.

The valve 243a is opened to allow a DCS gas to flow through the gas supply pipe 232a. The flow rate of the DCS gas is adjusted by the MFC 241a. The DCS gas is supplied into the process chamber 201 via the nozzle 249a and is exhausted from the exhaust pipe 231. At this time, the DCS gas is supplied to the wafers 200. Simultaneously, the valve 243d is opened to allow an $N_2$ gas to flow through the gas supply pipe 232d. The flow rate of the $N_2$ gas is adjusted by the MFC 241d. The $N_2$ gas is supplied into the process chamber 201 together with the DCS gas and is exhausted from the exhaust pipe 231. Furthermore, in order to prevent the DCS gas from entering the nozzle 249b, the valve 243e is opened to allow the $N_2$ gas to flow through the gas supply pipe 232e. The $N_2$ gas is supplied into the process chamber 201 via the gas supply pipe 232b and the nozzle 249b and is exhausted from the exhaust pipe 231.

By supplying the DCS gas to the wafer 200, it is possible to generate the treatment effect by the DCS and to allow the following process to proceed. This may make it possible to change the surface state of the wafers 200 to a state illustrated in FIG. 6B.

First, by supplying DCS containing halogen (Cl) having high electronegativity to the bottom portion of the concave portion, namely to the single crystal Si, it is possible to cleave an Si—O bond included in the natural oxide film 200b by bringing oxygen (O) of the natural oxide film 200b formed on the surface of the single crystal Si into contact with Cl of the DCS. That is to say, it is possible to cleave the Si—O bond terminating the surface of the single crystal Si by the polarity of the DCS. It may also be possible to cleave the Si—O bond terminating the surface of the single crystal Si by a small amount of Cl⁻ (Cl ion) generated by being separated from the DCS. Accordingly, a dangling bond of Si on the surface of the single crystal Si becomes free. That is to say, a dangling bond of a covalent bond of Si may be generated on the surface of the single crystal Si. Thus, an environment in which the homo-epitaxial growth as described below is easily promoted is established. In addition, as the aforementioned reaction is promoted on the bottom portion of the concave portion, the natural oxide film 200b formed on the surface is removed so that the surface of the single crystal Si is exposed. That is to say, the DCS gas acts as a cleaning gas for removing the natural oxide film 200b from the surface of the single crystal Si.

Furthermore, by supplying the DCS containing halogen (Cl) having high electronegativity to the side portion and upper portion of the concave portion, namely to the insulating film (SiO film) 200a, it is possible to cleave an Si—O bond included in the insulating film 200a by bringing O existing in the surface of the insulating film 200a into contact with Cl of the DCS. That is to say, it is possible to cleave the Si—O bond included in the surface of the insulating film 200a by the polarity of the DCS. It may also be possible to cleave the Si—O bond included in the surface of the insulating film 200a by a small amount of Cl⁻ generated by being separated from the DCS. This makes it possible to form the dangling bond of Si, namely an adsorption site of Si, on the surface of the insulating film 200a. Moreover, the dangling bond of Si is not naturally present or very little, if any, on the insulating film 200a such as the SiO film or the like. Thus, in this state, although step 2, which will be described later, of supplying the DS gas to the wafer 200 is performed, a nucleus of Si does not grow, or randomly grow (grow in the form of an island), if any, on the surface of the insulating film 200a.

By the aforementioned treatment effect, the environment in which the homo-epitaxial growth is easily promoted is established in the bottom portion of the concave portion. Furthermore, when the adsorption site of Si is formed on the side portion and upper portion of the concave portion, the valve 243a is closed to stop the supply of the DCS gas. At this time, the interior of the process chamber 201 is vacuum-exhausted by the vacuum pump 246 while opening the APC valve 244. Thus, the unreacted gas or the gas contributed to the aforementioned reaction, which remains within the process chamber 201, is removed from the interior of the process chamber 201. At this time, the supply of the $N_2$ gas into the process chamber 201 is maintained while opening the valves 243d and 243e. The $N_2$ gas acts as a purge gas. This makes it possible to enhance the effect of removing the gas, which remains within the process chamber 201, from the interior of the process chamber 201.

At this time, the gas remaining within the process chamber 201 may not be completely removed. If the amount of the gas remaining within the process chamber 201 is small, there is no possibility that an adverse effect is generated at step 2 which will be performed later. In addition, the flow rate of the $N_2$ gas supplied into the process chamber 201 does not need to be large. For example, by supplying the $N_2$ gas substantially in the same amount as the volume of the reaction tube 203 (the process chamber 201), it is possible to perform a purge operation such that an adverse effect is not generated at step 2. By not completely purging the interior of the process chamber 201 in this way, it is possible to shorten the purge time and to improve throughput. It is also possible to suppress the consumption of the $N_2$ gas to a necessary minimum level.

[Step 2]

After step 1 is completed, a DS gas and a PH gas are supplied to the wafer 200 in the process chamber 201.

At this step, the opening/closing control of the valves 243b, 243d, and 243e is performed in the same procedure as the opening/closing control of the valves 243a, 243d, and 243e performed at step 1. The flow rate of the DS gas flowing through the gas supply pipe 232b is adjusted by the MFC 241b. The DS gas is supplied into the process chamber 201 via the nozzle 249b and is exhausted from the exhaust pipe 231. At this time, the valve 243a is opened to allow a PH gas to flow through the gas supply pipe 232a. The flow rate of the PH gas is adjusted by the MFC 241a. The PH gas is supplied into the process chamber 201 via the nozzle 249a and is exhausted from the exhaust pipe 231. At this time, the PH gas is supplied to the wafer 200 together with and simultaneously with the DS gas.

Figure 6C:
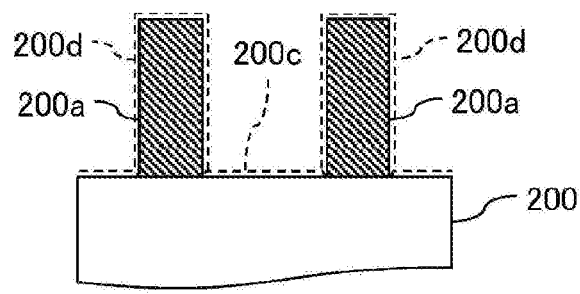
FIG. 6C is a view illustrating a cross-sectional structure of a wafer surface after a DC gas is supplied in the course of the seed step.
Figure 6D:
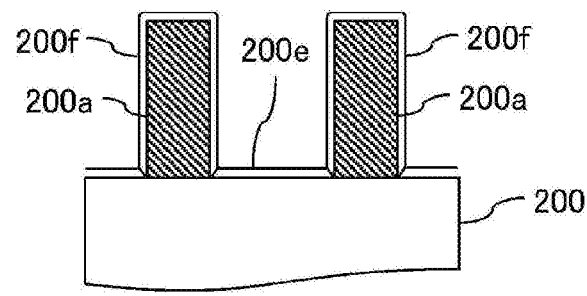
FIG. 6D is a view illustrating a cross-sectional structure of a wafer surface after the seed step is completed.

By supplying the DC gas and the PH gas to the wafer 200, it is possible to change the surface state of the wafer 200 to a state illustrated in FIG. 6C, namely a state in which two kinds of seeds are formed in parallel, through the following processes.

First, Si contained in the DS gas may be bonded to the dangling bond of Si formed by performing step 1 on the bottom portion of the concave portion, namely on the single crystal Si, to allow an Si crystal to undergo the epitaxial growth (gas-phase epitaxial growth) on the single crystal Si. Since the crystal as a underlying film and the crystal grown thereon are the same material (Si), such a growth is the homo-epitaxial growth. In the homo-epitaxial growth, the crystal having the same lattice constant and made of the same material grows in the same crystal orientation on the crystal as the base. Thus, in the homo-epitaxial growth, it is possible to obtain a less-defective high quality crystal, compared with the hetero-epitaxial growth in which the crystal as the underlying film and the crystal grown thereon are made of different materials. A nucleus (or film) formed at this time becomes a seed (first seed) 200c of a first Si film (epitaxial Si film) 200h, which will be described later. By supplying the PH gas together with the DS gas, a P component as a dopant can be doped in the seed 200c.

Furthermore, Si contained in the DS can be adsorbed to the adsorption site formed by performing step 1 on the side portion and upper portion of the concave portion, namely on the insulating film 200a. A crystal structure of nucleus formed by adsorbing Si to the adsorption site is amorphous, poly (polycrystal), or a mixed crystal of amorphous and poly. A nucleus formed at this time becomes a seed (second seed) 200d of a second Si film 200g which will be described later. By supplying the PH gas together with the DS gas, a P component as a dopant can be doped in the seed 200d.

When the formation of the first seed 200c and the second seed 200d, namely the formation of the two kinds of seeds (parallel seed process), is completed, the valves 243b and 243a are closed to stop the supply of the DS gas and the PH gas. Then, the unreacted gas, the gas contributed to the aforementioned reaction, or the reaction byproduct, which remains within the process chamber 201, is excluded from the interior of the process chamber 201 according to the same processing procedures as those of step 1. At this time, similar to step 1, the gas or the like remaining within the process chamber 201 may not be completely removed.

Furthermore, if step 2 is performed, at least a portion of the surface of the wafer 200, namely at least a portion of the surfaces of the seeds 200c and 200d, may be terminated by an Si—H bond included in the DS gas. The Si—H bond terminating the surface of the wafer 200 can be cleaved by supplying the DCS gas to the wafer 200 during the next step 1. That is to say, it is possible to cleave the Si—H bond terminating the surfaces of the seeds 200c and 200d by a small amount of Cl$^-$ generated by being separated from the DCS. Accordingly, the dangling bond of Si can be formed on the surfaces of the seeds 200c and 200d. That is to say, it is possible to again establish an environment in which the homo-epitaxial growth is easily promoted in the bottom portion of the concave portion, and again form the adsorption site of Si in the side portion and upper portion of the concave portion. Thus, the formation of the two kinds of seeds described above can begin without delay at next step 2.

In addition, if step 2 is performed, Si may be abnormally grown on the surface of the wafer 200. For example, if step 2 is performed, Si adsorbed to the surface of the wafer 200 may locally cohere to form an irregular structure in the surfaces of the seeds 200c and 200d. However, the abnormally-grown Si (the convex portion formed of the cohering Si) can be removed by supplying the DCS gas to the wafer 200 during the next step 1. That is to say, it is possible to etch the abnormally-grown Si by cleaving the Si—Si bond included in the abnormally-grown Si by a small amount of Cl$^-$ generated by being separated from the DCS. As a result, it is possible to smooth the surfaces of the seeds 200c and 200d, thus enhancing the surface roughness or the like of the finally-formed Si film. Here, the term "surface roughness" refers to a height difference (having the same meaning as that of surface roughness) of a film in in-plane of the wafer. Further, the surface roughness may indicate that the surface becomes smoother as its value grows smaller, and conversely, the surface becomes rougher as its value grows greater.

That is to say, the expression "the surface roughness is enhanced" refers to the fact that a difference in height of a film is reduced to enhance the smoothness of the surface.

The effects mentioned herein may be regarded as being included in the aforementioned treatment effect obtained by the DCS.

(Performing a Predetermined Number of Times)

At the seed step, a cycle which alternately, i.e., non-synchronously and non-simultaneously, performs steps 1 and 2 described above is implemented a predetermined number of times (once or more). By performing the seed step, it is possible to change the surface state of the wafer 200 to a state illustrated in FIG. 6D through the following processes. Furthermore, by non-simultaneously performing steps 1 and 2, it is possible to reduce the amount of particles generated within the process chamber 201.

First, a seed layer (first seed layer) 200e can be formed on the bottom portion of the concave portion, namely on the single crystal Si. The first seed layer 200e is formed by allowing an Si crystal to undergo a homo-epitaxial growth using the first seed 200c formed on the single crystal Si as a nucleus. A crystal structure of the first seed layer 200e is a single crystal inheriting the crystallinity of the underlying layer. That is to say, the first seed layer 200e is a single crystal Si layer (epitaxial Si layer) which is formed of the same material as that of the underlying single crystal Si and has the same lattice constant and crystal orientation.

Furthermore, a seed layer (second seed layer) 200f can be formed on the side portion and upper portion of the concave portion, namely on the insulating film 200a. The second seed layer 200f is a layer which is formed by allowing the second seed 200d to grow on the insulating film 200a with high density. The second seed layer 200f densely covers the surface of the insulating film 200a. A crystal structure of the second seed layer 200f is amorphous, poly, or a mixed crystal of amorphous and poly.

As described above, at the seed step, the first seed layer (the epitaxial Si layer) and the second seed layer (an amorphous Si layer, a poly-Si layer, or a mixed crystal Si layer in which amorphous and poly are mixed with each other) are formed in parallel on the single crystal Si and the insulating film 200a. That is to say, at this step, the two kinds of Si seed layers having different crystal structures are formed in parallel. Due to this, this step is referred to as the parallel seed step. At this step, it is possible to form the first seed layer 200e and the second seed layer 200f as dense layers by allowing the aforementioned treatment effect to be appropriately exhibited. As a result, an Si film finally formed can be obtained as a dense film with less pin holes or film damage (hereinafter, generally referred to as film damage or the like), thus making it possible to form a film with high tolerance to hydrogen fluoride (HF). Here, the term "pin hole" refers to a path along which an etchant such as an etching gas or an etching solution enters toward a base side of a film, when the etchant is supplied to the respective film. Furthermore, the term "film damage" refers to, for example, a defect occurring on a scale greater than that of a pin hole. The film damage or the like is prone to occur particularly when the Si film has a small film thickness. Thus, it can be said that the technical meaning of generating the treatment effect is remarkable particularly when the thickness of the Si film is reduced.

As mentioned above, since each of the first and second seeds 200c and 200d contains P, each of the first and second seed layers 200e and 200f also contains P as a dopant. Thus, each of the first and second seed layers 200e and 200f has conductivity.

Furthermore, the concentration of P in the first seed layer 200e may be set to be different from the concentration of P in the first Si film 200h to be described later. For example, the concentration of P in the first seed layer 200e may be set to be smaller (lower) than the concentration of P in the first Si film 200h.

Similarly, the concentration of P in the second seed layer 200f may be set to be different from the concentration of P in the second Si film 200g to be described below. For example, the concentration of P in the second seed layer 200f may be set to be smaller (lower) than the concentration of P in the second Si film 200g.

Under process conditions described later, the concentration of P in each of the first and second seed layers 200e and 200f may be set to fall within a range of, for example, $1\times10^1$ to $1\times10^{19}$ atoms/cm$^3$. Furthermore, the concentration of P in each of the first Si film 200h and the second Si film 200g may be set to fall within a range of, for example, $1\times10^{19}$ to $1\times10^{23}$ atoms/cm$^3$.

Hereinafter, the process conditions of the seed step will be described. The conditions described herein may be the ones for appropriately exhibiting the aforementioned treatment effect. Further, the conditions described herein may be the ones for appropriately exhibiting the effect of reducing the contact resistance or the effect of enhancing the surface roughness, which will be described later.

The supply flow rate of the DCS gas at step 1 may be set to fall within a range of, for example, 1 to 2,000 sccm. The supply time period of the DCS gas may be set to fall within a range of, for example, 2 to 10 min.

The supply flow rate of the DS gas at step 2 may be set to fall within a range of, for example, 1 to 2,000 sccm. Furthermore, the supply flow rate of the PH gas at step 2 may be set to fall within a range of, for example, 1 to 2,000 sccm. The supply flow rate of the PH gas at step 2 may be set to be less (lower) than that of the PH gas at the CVD-based film forming step to be described below. This makes it possible to set the concentration of P in each of the first and second seed layers 200e and 200f to become less than that in each of the first Si film 200h and the second Si film 200g. In addition, by setting the partial pressure (concentration) of the PH gas at step 2 to become less than that of the PH gas at the CVD-based film forming step as described below, the same effects can be achieved. The supply time period of each of the DS gas and the PH gas may be set to fall within a range of, for example, 0.5 to 10 min, specifically 1 to 5 min. Under process conditions to be described later, the concentration of P in the first and second seed layers 200e and 200f may be set to fall within a range of, for example, $1\times10^{10}$ to $1\times10^{19}$ atoms/cm$^3$. Furthermore, the concentration of P in the first Si film 200h and the second Si film 200g may be set to fall within a range of, for example, $1\times10^{19}$ to $1\times10^{23}$ atoms/cm$^3$.

The supply flow rate of the N$_2$ gas supplied from each gas supply pipes at steps 1 and 2 may be set to fall within a range of, for example, 0 to 10,000 sccm. Furthermore, by not supplying the N$_2$ gas, it becomes possible to increase the partial pressure of each process gas and to enhance the quality of a layer.

An internal pressure $P_1$ of the process chamber 201 at step 1 may be set to be larger than an internal pressure $P_2$ of the process chamber 201 at step 2 ($P_1 > P_2$). By doing so, it becomes possible to enhance the aforementioned treatment effect, compared with the relationship of $P_1 \leq P_2$.

The reason is because, by setting the relationship of $P_1 > P_2$, the flow velocity of the DCS gas supplied into the process chamber 201 is lower than that in the case of $P_1 \leq P_2$. This lengthens the time period during which the DCS is brought into contact with the surface of the wafer 200, which makes it possible to increase the amount of thermal energy radiated from the heated wafer 200 to the DCS. This promotes the separation of Cl from the DCS, thus increasing the amount of Cl$^-$ supplied to the wafer 200. As a result, it becomes possible to increase the treatment effect.

Furthermore, by making $P_1 > P_2$, the amount of the DCS supplied to the wafer 200 is increased, compared with the case of $P_1 \leq P_2$. In addition, in the case of $P_1 > P_2$, the time period during which the DCS is brought into contact with the surface of the wafer 200 is secured to be lengthened as mentioned above. Accordingly, the action caused by the polarity of the DCS, namely the cleavage of the Si—O bond or Si—H bond, is promoted, thus enhancing the treatment effect.

In addition, the internal pressure $P_1$ may be set at a pressure (first pressure) which falls within a range of, for example, 400 to 1,000 Pa under a first temperature to be described below.

If the internal pressure $P_1$ is less than 400 Pa, the amount of Cl separated from the DCS gas, namely the amount of Cl$^-$ supplied to the wafer 200, may be insufficient or the amount of the DCS supplied to the wafer 200 may be insufficient to obtain the aforementioned treatment effect. By setting the internal pressure $P_1$ to become 400 Pa or more, it is possible to sufficiently increase the amount of Cr or the amount of the DCS supplied to the wafer 200 and to obtain the aforementioned treatment effect.

If the internal pressure $P_1$ exceeds 1,000 Pa, there may be a case where Si contained in the DCS supplied at step 1 is deposited on the wafer 200. In this case, Si is deposited before the natural oxide film is removed from the surface of the single crystal Si. As such, the homo-epitaxial growth is not promoted on the single crystal Si (on the natural oxide film) so that an amorphous Si film or a poly-Si film grows thereon. Furthermore, if the internal pressure $P_1$ exceeds 1,000 Pa, there may also be a case where the aforementioned treatment effect using the polarity of the DCS or the like is not obtained. These problems can be addressed by setting the internal pressure $P_1$ to become 1,000 Pa or less.

In addition, the internal pressure $P_2$ may be set at a pressure (second pressure) which falls within a range of, for example, 250 to 350 Pa under the first temperature as described below.

If the internal pressure $P_2$ is less than 250 Pa, it becomes difficult for the DS supplied at step 2 to be discomposed, which makes it difficult to form the first seed 200c or the second seed 200d on the wafer 200. This problem can be addressed by setting the internal pressure $P_2$ to become 250 Pa or more.

If the internal pressure $P_2$ exceeds 350 Pa, an excessive gas phase reaction may occur. This may deteriorate the thickness uniformity or the step coverage of the first seed 200c or the second seed 200d, and therefore, the control of the thickness uniformity or the step coverage is difficult. In addition, there is a concern that particles may be generated within the process chamber 201. These problems can be addressed by setting the internal pressure $P_2$ to become 350 Pa or less.

From the foregoing, it is desirable that the relationship of $P_1 > P_2$ is established. The internal pressure $P_1$ may be set at a pressure which falls within a range of, for example, 400 to 1,000 Pa, and the internal pressure $P_2$ may be set at a pressure which falls within a range of, for example, 250 to 350 Pa. In addition, the internal pressure $P_2$ may be set to be greater than an internal pressure $P_3$ of the process chamber 201 at the CVD-based film forming step, which will be described below. That is to say, the relationship of $P_1 > P_2 > P_3$ may be established. By setting the relationship of the internal pressures $P_1$, $P_2$, and $P_3$ in this way and maintaining such a balance of pressure, it becomes possible to further increase the aforementioned treatment effect and to enhance the film thickness uniformity or the step coverage of an Si film finally formed.

The temperature of the heater 207 at steps 1 and 2 is set such that the temperature of the wafer 200 becomes a temperature (the first temperature) which falls within a range of, for example, 300 to 450 degrees C., specifically 370 to 390 degrees C.

If the temperature of the wafer 200 is lower than 300 degrees C., there may be a case where the aforementioned treatment effect is not achieved at step 1. In addition, there may be a case where the DS is hardly decomposed (pyrolyzed) at step 2. These problems can be addressed by setting the temperature of the wafer 200 to become 300 degrees C. or higher. By setting the temperature of the wafer 200 to become 370 degrees C. or higher, it becomes possible to further enhance the aforementioned treatment effect at step 1 and further promote the decomposition of the DS at step 2.

If the temperature of the wafer 200 exceeds 450 degrees C., there may be a case where Si contained in the DCS supplied at step 1 is deposited on the wafer 200. In this case, as described above, the homo epitaxial growth is not promoted on the single crystal Si (on the natural oxide film) so that an amorphous Si film or a poly-Si film grows thereon. Furthermore, if the temperature of the wafer 200 exceeds 450 degrees C., there may also be a case where the aforementioned treatment effect using the polarity of the DCS or the like is not obtained. These problems can be addressed by setting the temperature of the wafer 200 to become 450 degrees C. or lower. By setting the temperature of the wafer 200 to become 390 degrees C. or lower, it becomes possible to further increase the aforementioned treatment effect, while reliably suppressing the deposition of Si contained in the DCS on the wafer 200.

From the foregoing, the temperature of the wafer 200 may be set at a temperature which falls within a range of, for example, 300 to 450 degrees C., specifically 370 to 390 degrees C.

The number of times of implementing the cycle which alternately performs steps 1 and 2 may be set to fall within a range of, for example, 1 to 100 times, specifically 10 to 50 times, more specifically 10 to 30 times. Thus, the thickness of each of the first and second seed layers 200e and 200f formed under such a condition may be set at a thickness which falls within a range of, for example, 0.1 to 10 nm, specifically 1 to 5 nm, more specifically 1 to 3 nm. Furthermore, by performing the cycle a plural number of times, it becomes possible to increase the density of each of the first seed 200c and the second seed 200d, thus avoiding the first and second seed layers 200e and 200f from growing in an island shape. This makes it possible to form the laminated film formed on the wafer 200 as a dense film having good surface roughness and less film damage.

As the first process gas, it may be possible to use, in addition to the DCS gas, a chlorosilane precursor gas such as a monochlorosilane ($SiH_3Cl$, abbreviation: MCS) gas, a tetrachlorosilane ($SiCl_4$, abbreviation: STC) gas, a trichlorosilane ($SiHCl_3$, abbreviation: TCS) gas, a hexachlorodisilane ($Si_2Cl_6$, abbreviation: HCDS) gas or the like. Furthermore, in order to promote the cleavage reaction of the Si—O bond described above while suppressing the deposition of Si on the wafer 200 at step 1, a halosilane precursor gas having less Si and more halogen element (Cl or the like) contained in one molecule in number may be used as the first process gas. In addition, in order to appropriately suppress the cleavage reaction of the Si—O bond described above at step 1, a halosilane precursor gas having less halogen element (Cl or the like) contained in one molecule in number may be used.

As the second process gas, it may be possible to use, in addition to the DS gas, a silane precursor gas not containing a halogen element such as an MS gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like.

As the dopant gas, it may be possible to use, in addition to the P-containing gas such as the PH gas, a gas containing a chemical element of V-group such as arsenic (As), antimony (Sb) or the like, for example, an arsine ($AsH_3$) gas, a stibine ($SbH_3$) gas or the like. Furthermore, as the dopant gas, it may be possible to use, in addition to the gas containing a chemical element of V-group, a gas containing a chemical element of III-group such as boron (B), aluminum (Al), gallium (Ga) or the like, for example, a diborane ($B_2H_6$) gas, a trichloroborane ($BCl_3$) gas, a trimethylaluminum ($Al(CH_3)_3$) gas, a trimethylgalium ($Ga(CH_3)_3$) gas or the like.

As the inert gas, it may be possible to use, in addition to the $N_2$ gas, a rare gas such as, for example, an Ar gas, a He gas, a Ne gas, a Xe gas or the like.

(CVD-Based Film Forming Step)

After the first and second seed layers 200e and 200f are formed, an MS gas and a PH gas are supplied to the wafer 200 in the process chamber 201.

At this step, the opening/closing control of the valves 243c, 243a, 243d, and 243e is performed in the same procedure as the opening/closing control of the valves 243b, 243a, 243d, and 243e performed at step 2. The flow rate of the MS gas flowing through the gas supply pipe 232c is adjusted by the MFC 241c. The MS gas is supplied into the process chamber 201 via the gas supply pipe 232b and the nozzle 249b, and is exhausted from the exhaust pipe 231. The flow rate of the PH gas flowing through the gas supply pipe 232a is adjusted by the MFC 241a. The PH gas is supplied into the process chamber 201 via the nozzle 249a and is exhausted from the exhaust pipe 231. At this time, the MS gas is supplied to the wafer 200 together with and simultaneously with the PS gas.

Figure 6E:
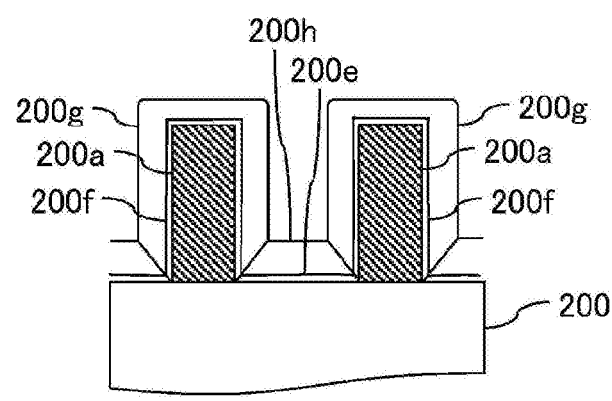
FIG. 6E is a view illustrating a cross-sectional structure of a wafer surface in the course of a CVD-based film forming step.
Figure 6F:
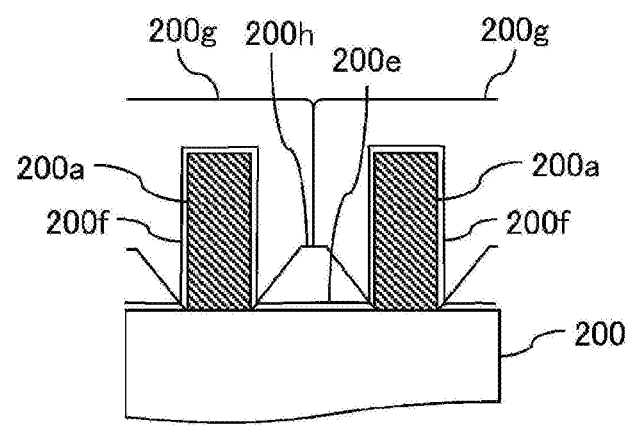
FIG. 6F is a view illustrating a cross-sectional structure of a wafer surface after the CVD-based film forming step is completed.

By supplying the MS gas and the PH gas to the wafer 200, it is possible to sequentially change the surface of the wafer 200 to states illustrated in FIGS. 6E and 6F through the following processes.

First, as illustrated in FIG. 6E, the first Si film 200h can be formed on the first seed layer 200e formed by performing the seed step on the bottom portion of the concave portion, namely on the single crystal Si. That is to say, it is possible to allow the first Si film (epitaxial Si film) 200h having the same crystal structure as that of the first seed layer 200e to further undergo the homo-epitaxial growth (gas-phase epitaxial growth) on the seed layer (the epitaxial Si layer 200e). The crystal structure of the first Si film 200h is a single crystal inheriting the crystallinity of the underlying film. By supplying the PH gas together with the MS gas, similar to the first seed layer 200e, the P component as a dopant can also be doped in the first Si film 200h. The first seed layer 200e is very thin and has the same crystal structure and material as those of the first Si film 200h. Thus, the first seed layer 200e may be regarded as being included in the first Si film 200h.

Furthermore, as illustrated in FIG. 6E, the second Si film 200g can be formed on the second seed layer 200f formed by performing the seed step on the side portion and upper portion of the concave portion, namely on the insulating film 200a. A crystal structure of the second Si film 200g is amorphous, poly, or a mixed crystal of amorphous and poly. That is to say, the second Si film 200g is an amorphous Si film, a poly-Si film, or a mixed crystal Si film in which amorphous and poly are mixed with each other. By supplying the PH gas together with the MS gas, similar to the second seed layer 200f, the P component as a dopant can also be doped in the second Si film 200g. The second seed layer 200f is very thin and has the same crystal structure and material as those of the second Si film 200g. Thus, the second seed layer 200f may be regarded as being included in the second Si film 200g.

By continuing the aforementioned processes, the growth of the first Si film 200h can be stopped by the growth of the second Si film 200g. That is to say, as illustrated in FIG. 6F, the upper side of the first Si film 200h is covered by the second Si film 200g grown from the side portion of the concave portion, which makes it possible to stop the homo-epitaxial growth of the first Si film 200h. In this state, a laminate structure (laminated film) obtained by laminating the second Si film 200g on the first Si film 200h is formed within the concave portion, namely on the wafer 200. That is to say, the Si film having an epitaxial Si film is formed in an interface making contact with the surface of the wafer 200. The interior of the concave portion is blocked, i.e., buried, by the laminated film. With this structure, it becomes possible to lower the contact resistance of the laminated film. As described above, in the present disclosure, the film having such a laminate structure will be referred to as an Si film.

After the laminated film is formed, the valves 243c and 243a are closed to stop the supply of the MS gas and the PH gas into the process chamber 201. Then, the unreacted gas, the gas contributed to the aforementioned reaction or the reaction byproduct, which remains within the process chamber 201, is removed from the interior of the process chamber 201 according to the same processing procedures as those of step 1 described above.

The process conditions of the CVD-based film forming step will now be described.

The supply flow rate of the MS gas may be set at a flow rate which falls within a range of, for example, 1 to 10,000 sccm. The supply time period of the MS gas may be appropriately decided depending on a film thickness of the Si film formed on the wafer 200. For example, the supply time period of the MS gas may be set to fall within a range of, for example, 1 to 2,000 min.

The supply flow rate of the PS gas may be appropriately decided depending on a specification of a device formed on the wafer 200. For example, the supply flow rate of the PS gas may be set to fall within a range of, for example, 1 to 10,000 sccm. The supply time period of the PS gas may be appropriately decided depending on a specification of a device formed on the wafer 200. For example, the supply time period of the PS gas may be set to fall within a range of, for example, 1 to 2,000 min.

The supply flow rate of the $N_2$ gas supplied from each line may be set at a flow rate which falls within a range of, for example, 0 to 10,000 sccm. Furthermore, by not supplying the $N_2$ gas, it becomes possible to increase the partial pressure of the respective process gases and to enhance the film quality.

The internal pressure $P_3$ of the process chamber 201 may be set at a pressure which falls within a range of, for example, 1 to 2,000 Pa. However, as mentioned above, the internal pressure $P_3$ may be set to be smaller than the internal pressure $P_2$ of the process chamber 201 at step 2 as the seed step. That is to say, the relationship of $P_1 > P_2 > P_3$ may be established. The internal pressure $P_3$ may be set at a pressure (third pressure) which falls within a range of, for example, 30 to 200 Pa, specifically 30 to 150 Pa, under a second temperature which will be described later.

If the internal pressure $P_3$ is less than 30 Pa, it is hard for a gas to be decomposed depending on a type of the third process gas. As a result, there may be a case where the homo-epitaxial growth of the first Si film 200h and the formation process of the second Si film 200g are hardly promoted (hereinafter, these processes will also be referred to as a CVD-based film forming process). For example, in the case of using the DS gas or the MS gas as the third process gas, if the internal pressure $P_3$ is less than 30 Pa, it is hard for these gases to be decomposed, which makes it difficult to promote the CVD-based film forming process described above. These problems can be addressed by setting the internal pressure $P_3$ to become 30 Pa or more.

If the internal pressure $P_3$ exceeds 200 Pa, for example, if it reaches about 300 Pa, an excessive gas phase reaction may occur. Thus, the film thickness uniformity or the step coverage is likely to deteriorate and the control of the film thickness uniformity or the step coverage is difficult. Furthermore, there is a concern that particles may be generated within the process chamber 201, which degrades the quality of the laminated film formed on the wafer 200. These problems can be addressed by setting the internal pressure $P_3$ to become 200 Pa or less. Further, these problems can be more reliably addressed by setting the internal pressure $P_3$ to become 150 Pa or less.

Thus, the internal pressure $P_3$ may be set at a pressure which falls within a range of, for example, 30 to 200 Pa, specifically 30 to 150 Pa.

The temperature of the heater 207 is set such that the temperature of the wafer 200 becomes a temperature (the second temperature) which is equal to or higher than the aforementioned first temperature. Specifically, the temperature of the heater 207 is set such that the temperature of the wafer 200 becomes a temperature (the second temperature) which falls within a range of, for example, 350 to 650 degrees C., specifically 400 to 550 degrees C.

If the temperature of the wafer 200 is lower than 350 degrees C., it is hard for a gas to be decomposed depending on a type of the third process gas. As a result, there may be a case where the CVD-based film forming process described above is hardly promoted. For example, in the case of using the DS gas as the third process gas, if the temperature of the wafer 20 is lower than 350 degrees C., it becomes difficult for the DS to decompose (pyrolysis) and the CVD-based film forming process described above is hardly promoted. This problem can be addressed by setting the temperature of the wafer 200 at 350 degrees C. or higher. Furthermore, by setting the temperature of the wafer 200 at 400 degrees C. or higher, it is easy to promote the CVD-based film forming process described above. For example, in the case of using the DS gas as the third process gas, by setting the temperature of the wafer 200 at 400 degrees C. or higher, the DS gas is likely to decompose, thus reliably performing the aforementioned CVD-based film forming process. In addition, in the case of using the MS gas as the third process gas, by setting the temperature of the wafer 200 at 450 degrees C. or higher, the MS gas is likely to decompose, thus reliably performing the aforementioned CVD-based film forming process.

If the temperature of the wafer 200 exceeds 650 degrees C., an excessive gas phase reaction may occur. This deteriorates the film thickness uniformity or the step coverage, which makes it difficult to control the film thickness uniformity or the step coverage. Furthermore, there is a concern that particles may be generated within the process chamber 201, which degrades the quality of the laminated film formed on the wafer 200. These problems can be addressed by setting the temperature of the wafer at 650 degrees C. or lower. In particular, by setting the temperature of the wafer 200 at 550 degrees C. or lower, it becomes easy to secure the film thickness uniformity or the step coverage, thus enhancing the controllability thereof.

Thus, the temperature of the wafer 200 may be set at a temperature (the second temperature) which falls within a range of, for example, 350 to 650 degrees C., specifically 400 to 550 degrees C. Furthermore, in the case where the temperature of the wafer 200 is set at a temperature which falls within a range of 350 to 520 degrees C., the second Si film 200g has a strong tendency to become an amorphous Si film. In addition, in the case where the temperature of the wafer 200 is set at a temperature which falls within a range of 520 to 530 degrees C., the second Si film 200g has a strong tendency to become a mixed crystal Si film in which amorphous and poly are mixed with each other. Furthermore, in the case where the temperature of the wafer 200 is set at a temperature which falls within a range of 530 to 650 degrees C., the second Si film 200g has a strong tendency to become a poly-Si film. In any case, the first Si film 200h undergoes the epitaxial growth so as to become an epitaxial Si film.

The thickness of the first Si film 200h and the thickness of the second Si film 200g which grow at the CVD-based film forming step are appropriately decided depending on a specification of a device formed on the wafer 200. For example, the thickness of each of the first Si film 200h and the second Si film 200g may be set at a thickness which falls within a range of, for example, 0.1 to 500 nm. Furthermore, the thickness of each of the first Si film 200h and the second Si film 200g may be set at a thickness which falls within a range of 0.1 to 10 nm, specifically, 0.1 to 5 nm.

As the third process gas, it may be possible to appropriately use, in addition to the MS gas, the aforementioned silicon hydride precursor gas not containing a halogen element or the aforementioned halosilane precursor gas. From the viewpoint of suppressing the halogen element from remaining in each Si film, the silicon hydride precursor gas not containing a halogen element may be used as the third process gas. Furthermore, from the viewpoint of enhancing the deposition rate of each Si film, the halosilane precursor gas having high reactivity may be used as the third process gas. In addition, from the viewpoint of enhancing the film thickness uniformity of each Si film, the silicon hydride precursor gas having a level lower than the second process gas may be used as the third process gas. That is to say, a gas containing a silicon hydride having a level higher than the third process gas may be used as the second process gas. A gas containing a silicon hydride having a level lower than the second process gas may be used as the third process gas. In this manner, by using the silane precursor gases having different molecular structures (chemical structures) at the seed step and the CVD-based film forming step, it becomes possible to meet two conflicting requirements. i.e., a film formation efficiency and properties such as the film thickness uniformity or the like, of the finally-formed laminated film.

As the dopant gas, it may be possible to use, in addition to the PH gas, various kinds of gases containing a chemical element of V-group or various kinds of gases containing a chemical element of III-group as described above. As the inert gas, it may be possible to use, in addition to the $N_2$ gas, various kinds of the rare gases as described above.

(Annealing Step)

After the formation of the first Si film 200h and the second Si film 200g is completed, the temperature of the heater 207 is suitably adjusted to heat-treat each Si film formed on the wafer 200.

This step may be performed by opening the valves 243d and 243e and supplying an $N_2$ gas into the process chamber 201, or may be performed by closing the valves 243d and 243e and stopping the supply of the $N_2$ gas to the process chamber 201. In any case, this step is performed in such a state that the valves 243a to 243c are closed and the supply of the silane precursor gas into the process chamber 201 is stopped.

Figure 6G:
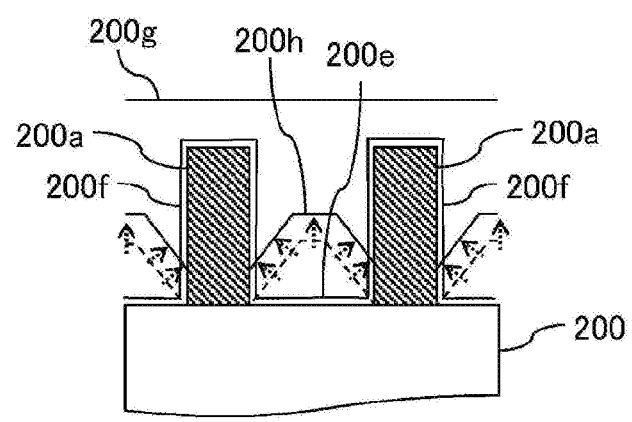
FIG. 6G is a view illustrating a cross-sectional structure of a wafer surface after an annealing step is completed.

By performing the annealing step, it is possible to change the laminated film of the first Si film 200h and the second Si film 200g formed on the wafer 200 to a state illustrated in FIG. 6G. That is to say, it is possible to change (modify) a portion of the second Si film 200g (the amorphous Si film, the poly-Si film, or the mixed crystal Si film in which amorphous and poly are mixed with each other) making contact with the first Si film 200h to a homo-epitaxial Si film by allowing the portion to undergo a homo-epitaxial growth (solid-phase epitaxial growth). That is to say, it is possible to change a crystal state of the portion of the second Si film 200g identically to that of the first Si film 200h. Such a homo-epitaxialized region may be considered as a portion of the first film 200h. That is to say, it is possible to expand the region occupied by the first Si film 200h in the laminated film by performing the annealing step. This makes it possible to further reduce the contact resistance of the laminated film. In addition, it is possible to make the laminated film more dense so as to become a film having higher HF tolerance.

The supply flow rate of the $N_2$ gas supplied from each line may be set at a flow rate which falls within a range of, for example, 0 to 10,000 sccm.

The internal pressure of the process chamber 201 may set at a pressure lower than atmospheric pressure. For example, the internal pressure of the process chamber 201 may be set at a pressure which falls within a range of 1 to 2,000 Pa, specifically 1 to 1,000 Pa.

The temperature of the heater 207 is set such that the temperature of the wafer 200 becomes a temperature (the third temperature) which is equal to or higher than the aforementioned second temperature. Specifically, the temperature of the heater 207 is set such that the temperature of the wafer 200 becomes a temperature (the third temperature) which falls within a range of, for example, 500 to 700 degrees C., specifically 550 to 600 degrees C.

If the temperature of the wafer 200 is lower than 500 degrees C., the solid-phase epitaxial growth is hardly promoted, which makes it difficult for the portion of the second Si film 200g making contact with the first Si film 200h to undergo the homo-epitaxial growth. This problem can be addressed by setting the temperature of the wafer 200 at 500 degrees C. or higher. By setting the temperature of the wafer 200 at 550 degrees C. or higher, it becomes possible to enhance the growth efficiency of the solid-phase epitaxial growth and to allow the portion of the second Si film 200g making contact with the first Si film 200h to efficiently undergo the homo-epitaxial growth.

If the temperature of the wafer 200 exceeds 700 degrees C., there may be a case where the portion of the second Si film 200g making contact with the first Si film 200h undergoes a polycrystal growth, instead of undergoing the homo-epitaxial growth. This problem can be addressed by setting the temperature of the wafer 200 at 700 degrees C. or lower. By setting the temperature of the wafer 200 at 600 degrees C. or lower, it is easy for the portion of the second film 20g making contact with the first Si film 200h to undergo the solid-phase epitaxial growth, which makes it easy to undergo the homo-epitaxial growth.

Thus, the temperature of the wafer 200 may be set at a temperature (the third temperature) which falls within a range of, for example, 500 to 700 degrees C., specifically 550 to 600 degrees C. In addition, in the aforementioned temperature zone, the solid-phase epitaxial growth can be more appropriately promoted by setting the temperature of the wafer 200 at a temperature close to a low temperature, namely by slowly heat-treating the wafer 200 at the temperature close to a low temperature.

As the inert gas, it may be possible to use, in addition to the $N_2$ gas, various kinds of the rare gases described above.

(Purging and Atmospheric Pressure Returning)

Upon completion of the heat treatment, the $N_2$ gas is supplied from the respective supply pipes 232d and 232e into the process chamber 201 and is exhausted from the exhaust pipe 231. The $N_2$ gas acts as a purge gas. Thus, the interior of the process chamber 201 is purged with the inert gas, and the gas or the reaction byproduct which remains within the process chamber 201, is removed from the interior of the process chamber 201 (after-purging). Thereafter, the internal atmosphere of the process chamber 201 is replaced by the inert gas (inert gas replacement). The internal pressure of the process chamber 201 is returned to atmospheric pressure (atmospheric pressure returning).

(Boat Unloading and Wafer Discharging)

The seal cap 219 is moved down by the boat elevator 115 to open the lower end of the manifold 209. Then, the processed wafers 200 are unloaded from the lower end of the reaction tube 203 to outside of the reaction tube 203 while being supported by the boat 217 (boat unloading). The processed wafers 200 are discharged from the boat 217 (wafer discharging).

(3) Effects According to the Present Embodiment

According to the present embodiment, one or more effects set forth below may be achieved.

(a) By performing step 1 of supplying the DCS gas at the seed step, it is possible to remove the natural oxide film 200b formed on the surface of the single crystal Si and also to generate a dangling bond of Si on the surface of the single crystal Si by the DCS-based treatment effect. This makes it possible to grow the first seed layer 200e as an epitaxial Si layer on the single crystal Si. In addition, by forming the first seed layer 200e as the epitaxial Si layer in this way, it is possible to allow Si to continuously undergo the epitaxial growth on the first seed layer 200e at the CVD-based film forming step, thus forming the first Si film 200h as an epitaxial Si film on the first seed layer 200e.

As a result, it is possible to form a laminated film obtained by laminating the second Si film 200g on the first Si film 200h, which includes the epitaxial Si film as the underlying film (formed at an interface between the film and the surface of the wafer 200), on the surface (the single crystal Si) of the wafer 200. The laminated film has lower contact resistance with respect to the wafer 200 or the like, compared with an Si monofilm formed of only an amorphous Si, a poly-Si, or a mixed crystal Si film in which amorphous and poly are mixed with each other. Thus, the laminated film becomes a good film having excellent electrical characteristics. Furthermore, instead of the DCS gas, in the case of using a silane precursor gas not containing a halogen element, such as a silicon hydride precursor gas, an aminosilane precursor gas or the like, it is hard for the epitaxial Si film to grow on the single crystal Si. This makes it difficult to obtain the aforementioned effects.

(b) It is possible to provide conductivity to the first and second seed layers 200e and 200f by doping P as a dopant in each of the first and second seed layers 200e and 200f at the seed step. As a result, it is possible to further lower the contact resistance of the laminated film including the first and second seed layers 200e and 200f as components. That is to say, by doping P in each of the first and second seed layers 200e and 200f, it is possible to further enhance the excellent electrical characteristics of the laminated film including the epitaxial Si film as the underlying film. According to the present embodiment, by combining two processes in which one is configuring the underlying film of the laminated film as the epitaxial Si film and the other is doping P in the seed layer as a portion of the laminated film, it is possible to remarkably enhance the electrical characteristics of the laminated film. This makes it possible to lower a start-up voltage of a semiconductor device including the laminated film or to reduce power consumption.

Furthermore, in the case of doping P in each of the first and second seed layers 200e and 200f, it was confirmed that, even though the thickness of each of the first and second seed layers 200e and 200f is set at a thickness of 1 nm or more, for example, at a thickness exceeding 10 nm, the laminated film formed on the wafer 200 has low contact resistance and excellent electrical characteristics. In addition, it was confirmed that, in the case where the thickness of each of the first and second seed layers 200e and 200f is set at a thickness of 1 nm or more, for example, at a thickness which falls within a range of 2 to 3 nm, the laminated film formed on the wafer 200 becomes a dense film having excellent surface roughness, less film damage or the like, as well as excellent electrical characteristics. It is considered that this is because the first and second seed layers 200e and 200f are in a continuous state (non-island state) by setting the thickness of each of the first and second seed layers 200e and 200f at a thickness of 1 nm or more, thus allowing the first Si film 200h or the second Si film 200g to easily grow at a uniform timing or speed over in-plane of the wafer 200.

In contrast, in the case where P is not doped in each of the first and second seed layers 200e and 200f, in order to lower the contact resistance of the laminated film formed on the wafer 200 to a practical level, the thickness of each of the first and second seed layers 200e and 200f is required to be set at a thickness of, for example, less than 1nm. In addition, if the thickness of each of the first and second seed layers 200e and 200f is set at a thickness of less than 1 nm, for example, although the contact resistance is lowered down to a practical level, the surface roughness or the like of the laminated film formed on the wafer 200 may be degraded. It is considered that this is because, if the thickness of each of the first and second seed layers 200e and 200f is set at a thickness of less than 1 nm, the first and second seed layers 200e and 200f are in a discontinuous state (island state), and thus, when the first Si film 200h or the second Si film 200g grow, a local film formation delay (incubation time) or the like is likely to occur in in-plane of the wafer 200.

(c) By doping P in each of the first and second seed layers 200e and 200f, it is possible to suppress P from diffusing from the first Si film 200h toward the first seed layer 200e and from the second Si film 200g toward the second seed layer 200f, respectively. As a result, it is possible to form the first Si film 200h and the second Si film 200g as films in which the concentration of P is less changed (concentration balance is good) in a thickness direction, and to maintain such a state even after the film formation. This makes it possible to suppress an increase in contact resistance or an increase in channel resistance. In addition, it is possible to suppress a fluctuation in threshold voltage and to suppress an increase in power consumption.

(d) The concentration of P in each of the first and second seed layers 200e and 200f is a concentration with which the aforementioned effects such as the reduction in contact resistance are achieved. Further, the concentration of P in each of the first and second seed layers 200e and 200f may be set at a concentration smaller than the concentration of P in each of the first Si film 200h and the second Si film 200g. By setting the concentration of P in the first seed layer 200e to a relatively small value as described above, it is possible to establish a state in which the epitaxial growth is further easily promoted, thus forming the first seed layer 200e formed on the wafer 200 as a more proper epitaxial Si layer. As a result, it is possible to more reliably achieve the aforementioned effect of reducing the contact resistance by forming the underlying film of the laminated film as the epitaxial Si layer. Furthermore, by setting the concentration of P in each of the first and second seed layers 200e and 200f to the relatively small value as described above, it is also possible to avoid the degradation of surface roughness of a formed layer or film. In addition, by setting the supply flow rate, the partial pressure, and the concentration of the PH gas in the formation of the first and second seed layers 200e and 200f to become smaller than those of the PH gas in the formation of the first Si film 200h and the second Si film 200g, it is possible to establish an environment in which the epitaxial growth of the first seed layer 200e is more easily promoted and to establish an environment in which it is easy to suppress the degradation of surface roughness of a formed layer or film. For example, these effects can be realized by setting the supply flow rate of the PH gas in the formation of the first and second seed layers 200e and 200f to fall within a range of 1 to 2,000 sccm and by setting the supply flow rate of the PH gas in the formation of the first Si film 200h and the second Si film 200g to fall within a range of 2,500 to 10,000 sccm.

(e) By setting, at the seed step, the internal pressure $P_1$ of the process chamber 201 at step 1 to become greater than the internal pressure $P_2$ of the process chamber 201 at step 2 ($P_1 > P_2$), it is possible to enhance the aforementioned treatment effect, compared with the case of $P_1 \leq P_2$. This makes it possible to form the first seed layer and the second seed layer as dense layers. As a result, it is possible to form the laminated film as a dense film with less film damage or the like. Furthermore, this also makes it possible to reduce the contact resistance of the laminated film.

(f) By setting, at the seed step, the internal pressure $P_2$ of the process chamber 201 at step 2 to become greater than the internal pressure $P_3$ of the process chamber 201 at the CVD-based film forming step ($P_2 > P_3$), it is possible to increase the aforementioned treatment effect and to enhance the film thickness uniformity or the step coverage of the finally-formed Si film. That is to say, by setting the internal pressures $P_1$, $P_2$, and $P_3$ of the process chamber 201 to satisfy a relationship of $P_1 > P_2 > P_3$ at each step and maintaining such a pressure balance, it is possible to increase the aforementioned treatment effect and to enhance the film thickness uniformity or the step coverage of the finally-formed Si film, compared with the case where the internal pressure $P_2$ is set to be smaller than the internal pressure $P_3$ ($P_1 > P_3 > P_2$) or the case where the internal pressures $P_2$ and $P_3$ are set equally to each other ($P_1 > P_2 = P_3$). This makes it possible to form the finally-formed Si film as a film which has high film thickness uniformity and step coverage and which is further dense with less film damage or the like. Furthermore, this also makes it possible to reduce the contact resistance of the laminated film.

(g) The effects mentioned above can be similarly achieved in the case where a halosilane precursor gas other than the DCS gas is used as the first process gas, or in the case where a silicon hydride precursor gas other than the DS gas is used as the second process gas, or in the case where a silicon hydride precursor gas other than the MS gas is used as the third process gas, or in the case where a dopant gas other than the PH gas is used as the dopant gas.

(4) Modifications

The film forming sequence of the present embodiment is not limited to the aforementioned one but may be modified as in modifications described below.
(Modification 1)

The seed step may include a period during which the step of supplying a DCS gas and the step of supplying a PH gas are simultaneously performed. For example, as in a film forming sequence illustrated below, at the seed step, a step of simultaneously performing the step of supplying a DCS gas and the step of supplying a PH gas, and a step of supplying a DS gas may be alternately performed.

[(DCS+PH→DS)×n→MS+PH]→ANL ⇒ Si

In this modification, it is possible to set the concentration of P in the first and second seed layers 200e and 200f formed at the seed step to become smaller than the concentration of P in the first and second seed layers 200e and 200f formed at the seed step of the film forming sequence illustrated in FIG. 4, respectively. That is to say, it is possible to adjust the concentration of P in each seed layer to a lower concentration level.

(Modification 2)

The seed step may include a period during which the step of supplying a DCS gas and the step of supplying a PH gas are simultaneously performed and a period during which the step of supplying a DS gas and the step of supplying a PH gas are simultaneously performed. For example, as in a film forming sequence illustrated below, at the seed step, a step of simultaneously performing the step of supplying a DCS gas and the step of supplying a PH gas, and a step of simultaneously performing the step of supplying a DS gas and the step of supplying a PH gas may be alternately performed.

[(DCS+PH→DS+PH)×n→MS+PH]→ANL ⇒ Si

In this modification, it is possible to set the concentration of P in each of the first and second seed layers 200e and 200f formed at the seed step to become greater than the concentration of P in each of the first and second seed layers 200e and 200f formed at the seed step of the film forming sequence illustrated in FIG. 4, respectively. That is to say, it is possible to finely adjust the concentration of P in each seed layer to a high concentration level. Furthermore, at the seed step, in a state in which the step of supplying the PH gas is continuously performed, the step of supplying the DCS gas and the step of supplying the DS gas may be alternately performed. Even in this case, the same effects as those of this modification may be achieved.

(Modification 3)

At the seed step, the supply flow rate of the PH gas may be set to a relatively small level at its initial stage, and may be gradually increased whenever a cycle is performed a predetermined number of times. That is to say, the concentration of P in each of the first and second seed layers 200e and 200f may be set to be decreased as it goes to the wafer 200 and the insulating film 200a and set to be increased as it goes to the first Si film 200h and the second Si film 200g.

Furthermore, as in the film forming sequence illustrated in FIG. 5 and the following description, at the seed step, there may be performed: a step of forming a first seed layer (non-doped seed layer) not doped with P on a wafer 200 by performing a first set including the step of supply a DCS gas and the step of supplying a DS gas a predetermined number of times (m times); and a step of forming a second seed layer (doped seed layer) doped with P on the first seed layer by a second set including the step of supply a DCS gas, the step of supplying a DS gas, and the step of supplying a PH gas a predetermined number of times (n times).

[(DCS→DS)×m→(DCS→DS+PH)×n→MS+ PH]→ANL ⇒ Si

In addition, FIG. 5 illustrates an example in which the number of times of performing the first set is set to two times (where m=2), and the step of supplying the DCS gas and the step of simultaneously performing the step of supplying the DCS gas, the step of supplying the DS gas and the step of supplying the PH gas are alternately performed in the second set.

In this modification, by reducing the supply flow rate of the PH gas, namely a doped amount of P, at an initial stage of forming the first and second seed layers 200e and 200f, it is possible to establish an environment or a state in which the first seed layer 200e more easily undergoes the epitaxial growth. This makes it possible to establish an environment or a state in which the first Si film 200h more easily undergoes the epitaxial growth. As a consequence, the aforementioned effect of reducing the contact resistance which is obtained by modifying an interface between the laminated film and the wafer 200 to the epitaxial Si film, can be easily achieved. In addition, in this modification, by increasing the supply flow rate of the PH gas, namely the doped amount of P, after the initial stage of forming the first and second seed layers 200e and 200f, the conductivity of the first and second seed layers 200e and 200f can be easily increased. As a consequence, the aforementioned effect of reducing the contact resistance, which is obtained by doping P in the seed layer as a portion of the laminated film, can be easily achieved.

(Modification 4)

The seed step may include a period during which the step of supplying a DCS gas, the step of supplying a DS gas, and the step of supplying a PH gas are simultaneously performed.

For example, as in a film forming sequence illustrated below, at the seed step, a cycle which performs the step of supplying a DCS gas, the step of supplying a DS gas, and the step of supplying a PH gas in this order may be performed a predetermined number of times (n times).

[(DCS→DS→PH)×n→MS+PH]→ANL ⇒ Si

Furthermore, for example, as in a film forming sequence illustrated below, at the seed step, a cycle which performs the step of supplying a DCS gas, the step of supplying a PH gas, and the step of supplying a DS gas in this order may be performed a predetermined number of times (n times).

[(DCS→PH→DS)×n→MS+PH]→ANL ⇒ Si

In addition, for example, as in a film forming sequence illustrated below, at the seed step, a cycle including a step of alternately performing the step of supplying a DCS gas, the step of supplying a DS gas and the step of supplying a PH gas a predetermined number of times (m times), may be performed a predetermined number of times (n times).

[[DCS→(DS→PH)×m]→MS+PH]→ANL ⇒ Si

According to these modifications, it is possible to set the concentration of P in each of the first and second seed layers 200e and 200f to become smaller than the concentration of P in each of the first and second seed layers 200e and 200f formed at the seed step of the film forming sequence illustrated in FIG. 4. That is to say, it is possible to adjust the concentration of P in each seed layer to a lower concentration level. Furthermore, it is possible to establish an environment or a state in which the epitaxial growth of the first seed layer 200e is relatively easily promoted. Further, the aforementioned effect of reducing contact resistance, which is obtained by modifying an interface between the laminated structure and the wafer 200 to the epitaxial Si film, can be easily achieved. In addition, this modification may be arbitrarily combined with the film forming sequence illustrated in FIG. 4 or any other modifications.

(Modification 5)

At the seed step of the film forming sequence illustrated in FIG. 4, the residual gas removing step of removing the residual gas or the like from the interior of the process chamber 201 has been described to be performed at each of steps 1 and 2, but this residual gas removing step may not be performed. That is to say, at the seed step, the step of supplying a DCS gas and the step of simultaneously supplying a DS gas and a PH gas may be alternately performed while bypassing the residual gas removing step. According to this modification, it is possible to shorten the time required for the seed step, thus enhancing productivity of a film formation process.

(Modification 6)

As in a film forming sequence described below, at the CVD-based film forming step, the PH gas may not be supplied.

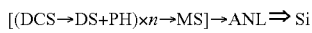
[(DCS→DS+PH)×n→MS]→ANL ⇒ Si

According to this modification, it is possible to spread a portion of P contained in the first and second seed layers 200e and 200f to the Si film formed at the CVD-based film forming step, and to dope an extremely small amount of P in the Si film formed at the CVD-based film forming step. That is to say, it is possible to form the laminated film formed on the wafer 200 as an Si film with P added in an extremely small concentration, which is difficult to realize in the film forming sequence illustrated in FIG. 4 or in various modifications described above.

(Modification 7)

As the first process gas, it may be possible to use a chlorosilane precursor gas other than that used in the DCS gas. A film forming sequence using an HCDS gas or an MCS gas as the first process gas is illustrated as follows.

[(HCDS→DS+PH)×n→MS]→ANL ⇒ Si

[(MCS→DS+PH)×n→MS]→ANL ⇒ Si

Even in this modification, by setting various process conditions to become similar to those of the film forming sequence illustrated in FIG. 4, the same effects as those of the film forming sequence illustrated in FIG. 4 may be achieved. In addition, it is possible to further enhance the aforementioned treatment effect by using, as the first process gas, an HCDS gas with a greater amount of Cl atoms contained in one molecule than in the DCS gas, compared with the case of using in the film forming sequence illustrated in FIG. 4. Furthermore, it is possible to appropriately suppress the aforementioned treatment effect by using, as the first process gas, an MCS gas with a smaller amount of Cl atoms contained in one molecule, than in the DCS gas, compared with the case of using the film forming sequence illustrated in FIG. 4. It is also possible to reduce the concentration of Cl in the film.

(Modification 8)

As the first process gas, a silane precursor gas containing C, for example, a silane precursor gas having an Si—C bond, rather than a silane precursor gas not containing C, may be used. A film forming sequence in which a 1,1,2,2-tetrachloro-1,2-dimethyldisilane (($CH_3)_2Si_2Cl_4$, abbreviation: TCDMDS) gas and a bis (trichlorosilyl) methane (($SiCl_3)_2CH_2$, abbreviation: BTCSM) gas are used as the first process gas is illustrated as follows.

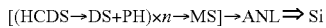
[(TCDMDS→DS+PH)×n→MS]→ANL ⇒ Si

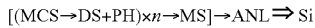
[(BTCSM→DS+PH)×n→MS]→ANL ⇒ Si

Even in this modification, by setting various process conditions to become similar to those of the film forming sequence illustrated in FIG. 4, the same effects as those of the film forming sequence illustrated in FIG. 4 may be achieved. Furthermore, according to this modification, it is possible to dope a small amount of C in the first and second seed layers 200e and 200f formed at the seed step. By doping C in the first seed layer 200e, it is easy to suppress the polyzation of the first seed layer 200e and to form the first seed layer 200e as an epitaxial Si layer. In addition, by doping C in the second seed layer 200f, it is possible to reduce a grain size of a crystal grain constituting the second seed layer 200f, easily forming the second seed layer 200f as a dense layer. However, there may be a case where it is intended to avoid doping of C in the first seed layer 200e and 200f depending on a specification of a device. In this case, as in the film forming sequence illustrated in FIG. 4 or the like, the silane precursor gas not containing C may be used as the first process gas.

(Modification 9)

As the first process gas, a halosilane precursor gas containing a halogen group other than Cl, for example, a halosilane precursor gas containing F, Br, I or the like may be used. For example, as the first process gas, a fluorosilane precursor gas such as a tetrafluorosilane ($SiF_4$) gas or the like, a bromosilane precursor gas such as a tetrabromosilane ($SiBr_4$) gas or the like, or an iodosilane precursor gas such as a tetraiodosilane ($SiI_4$) gas or the like may be used.

Even in this modification, by setting various process conditions to become similar to those of the film forming sequence illustrated in FIG. 4, the same effects as those of the film forming sequence illustrated in FIG. 4 may be achieved. However, in the case where a gas containing F is used as the first process gas, there may be a case where an underlying film (the surface of the single crystal Si or the surface of the insulating film 200a) in the film formation process is pre-etched. In order to suppress such a pre-etching, a halosilane precursor gas containing a halogen group other than F may be used as the first process gas.

(Modification 10)

As the first process gas, a chloro-based gas containing a chloro group not containing Si may be used. Furthermore, a halogen-based gas containing a halogen group other than Cl, not containing Si, may be used. For example, as the first process gas, a hydrogen chloride (HCl) gas, a chlorine ($Cl_2$) gas, a $BCl_3$ gas, or a chlorine trifluoride ($ClF_3$) gas may be used.

Even in this modification, by setting various process conditions to become similar to those of the film forming sequence illustrated in FIG. 4, the same effects as those of the film forming sequence illustrated in FIG. 4 may be achieved. However, in the case where a halogen-based gas not containing Si is used as the first process gas, there may be a case where an underlying film in the film formation process is pre-etched. In order to suppress such a pre-etching, a halogen-based gas containing Si, for example, a chlorosilane precursor gas or the like may be used as the first process gas.

(Modification 11)

As the second process gas, a silane precursor gas containing not only a silane precursor gas not containing C and nitrogen (N) but also a silane precursor gas containing C and N may be used. For example, as the second process gas, an aminosilane precursor gas may be used. As the aminosilane precursor gas, for example, it may be possible to use a butylaminosilane (BAS) gas, a bis-tertiary-butylaminosilane (BTBAS) gas, a dimethylaminosilane (DMAS) gas, a bis-dimethylaminosilane (BDMAS) gas, a tris-dimethylaminosilane (3DMAS) gas, a diethylaminosilane (DEAS) gas, a bis-diethylaminosilane (BDEAS) gas, a dipropylaminosilane (DPAS) gas, a diisopropylaminosilane (DIPAS) gas or the like. A film forming sequence using a BDEAS gas or a DIPAS gas as the second process gas is illustrated as follows.

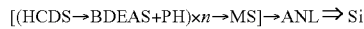

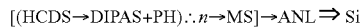

Even in this modification, by setting various process conditions to become similar to those of the film forming sequence illustrated in FIG. 4, the same effects as those of the film forming sequence illustrated in FIG. 4 may be achieved. Furthermore, according to this modification, similar to modification 8, it is possible to dope a small amount of C in the first and second seed layers 200e and 200f formed at the seed step. Thus, the same effects as those of the modification 8 may be achieved.

(Modification 12)

When performing the seed step, a hydrogen ($H_2$) gas may be supplied to the wafer 200 together with the first process gas or the second process gas. For example, the $H_2$ gas may be supplied to the wafer 200 together with the DCS gas at step 1. Furthermore, the $H_2$ gas may be supplied to the wafer 200 together with the DS gas and the PH gas at step 2. The $H_2$ gas may be supplied from, for example, one of the gas supply pipes 232a to 232c. The supply flow rate of the $H_2$ gas may be set at a flow rate which falls within a range of, for example, 1 to 10,000 sccm.

Even in this modification, by setting various process conditions to become similar to those of the film forming sequence illustrated in FIG. 4, the same effects as those of the film forming sequence illustrated in FIG. 4 may be achieved. Furthermore, according to this modification, it is possible to supply the $H_2$ gas together with the process gas to the wafer 200, thus appropriately suppressing adsorption of Si on the wafer 200 at the seed step and enhancing in-plane thickness uniformity of the first seed layer and the second seed layer. As a consequence, it is possible to form the finally-formed Si film as a dense film with less film damage or the like.

(Modification 13)

When performing the CVD-based film forming step, the $H_2$ gas may be supplied to the wafer 200 together with the third process gas. The $H_2$ gas may be supplied from, for example, one of the gas supply pipes 232a to 232c. The supply flow rate of the $H_2$ gas may be set at a flow rate which falls within a range of, for example, 1 to 10,000 sccm.

Even in this modification, by setting various process conditions to become similar to those of the film forming sequence illustrated in FIG. 4, the same effects as those of the film forming sequence illustrated in FIG. 4 may be achieved. Furthermore, according to this modification, it is possible to supply the $H_2$ gas together with the process gas to the wafer 200, thus appropriately suppressing adsorption of Si on the wafer 200 at the CVD-based film forming step and enhancing in-plane film thickness uniformity of the finally-formed Si film. In addition, this modification may be combined with modification 12. That is to say, at each of the seed step and the CVD-based film forming step, the $H_2$ gas may be supplied together with various kinds of the process gases. Furthermore, the $H_2$ gas may be constantly supplied at least until the CVD-based film forming step is completed after the start of the seed step. By constantly supplying the $H_2$ gas, it is possible to further enhance an effect obtained by adding the $H_2$ gas.

Other Embodiments of Present Disclosure

While some embodiments of the present disclosure have been specifically described above, the present disclosure is not limited to the aforementioned embodiments but may be differently modified without departing from the spirit of the present disclosure.

For example, in the aforementioned embodiments, there has been described a case where a series of the seed step to the annealing step are performed within the same process chamber (in-situ), but the present disclosure is not limited thereto. For example, the seed step and the CVD-based film forming step, and the annealing step may be performed within different process chambers (ex-situ). If a series of steps are performed in-situ, the wafer 200 can be processed in a consistent way while keeping the wafer 200 under vacuum, without exposing the wafer 200 to atmosphere in the course of the process. Thus, it is possible to stably perform the substrate process. If some steps are performed ex-situ, internal temperatures of the respective process chambers can be set in advance, for example, at a process temperature at each step or a temperature close thereto. This makes it possible to shorten the time required in adjusting the temperature, improving production efficiency.

Furthermore, for example, in the embodiment, the modifications and the like described above, there has been described an example in which the annealing step is performed after the formation of the first Si film and the second Si film, but the annealing step may be omitted. That is to say, according to the methods of the embodiments or the modifications described above, it is possible to form the epitaxial Si film (the first Si film) on an interface between the single crystal Si and the second Si film, without performing the annealing step, namely in an as-depo state. Thus, the annealing step may not necessarily be performed to obtain such configuration (structure). However, even in this case, it is possible to enlarge the area of the epitaxial film by performing the annealing step, further reducing the contact resistance.

The methods of the embodiments or the modifications described above may be applied to a process of forming an Si film, which is performed as one of manufacturing processes of a dynamic random access memory (hereinafter sometimes simply referred to as "DRAM") as a volatile semiconductor memory device (volatile memory). Hereinafter, a structure of a major part of a DRAM manufactured by applying the methods of the embodiments or the modifications described above will be described with reference to FIG. 9.

Furthermore, here, for the sake of convenience, some of the films or structures constituting the DRAM will be described and descriptions of other films or structures will be omitted.

Figure 9:
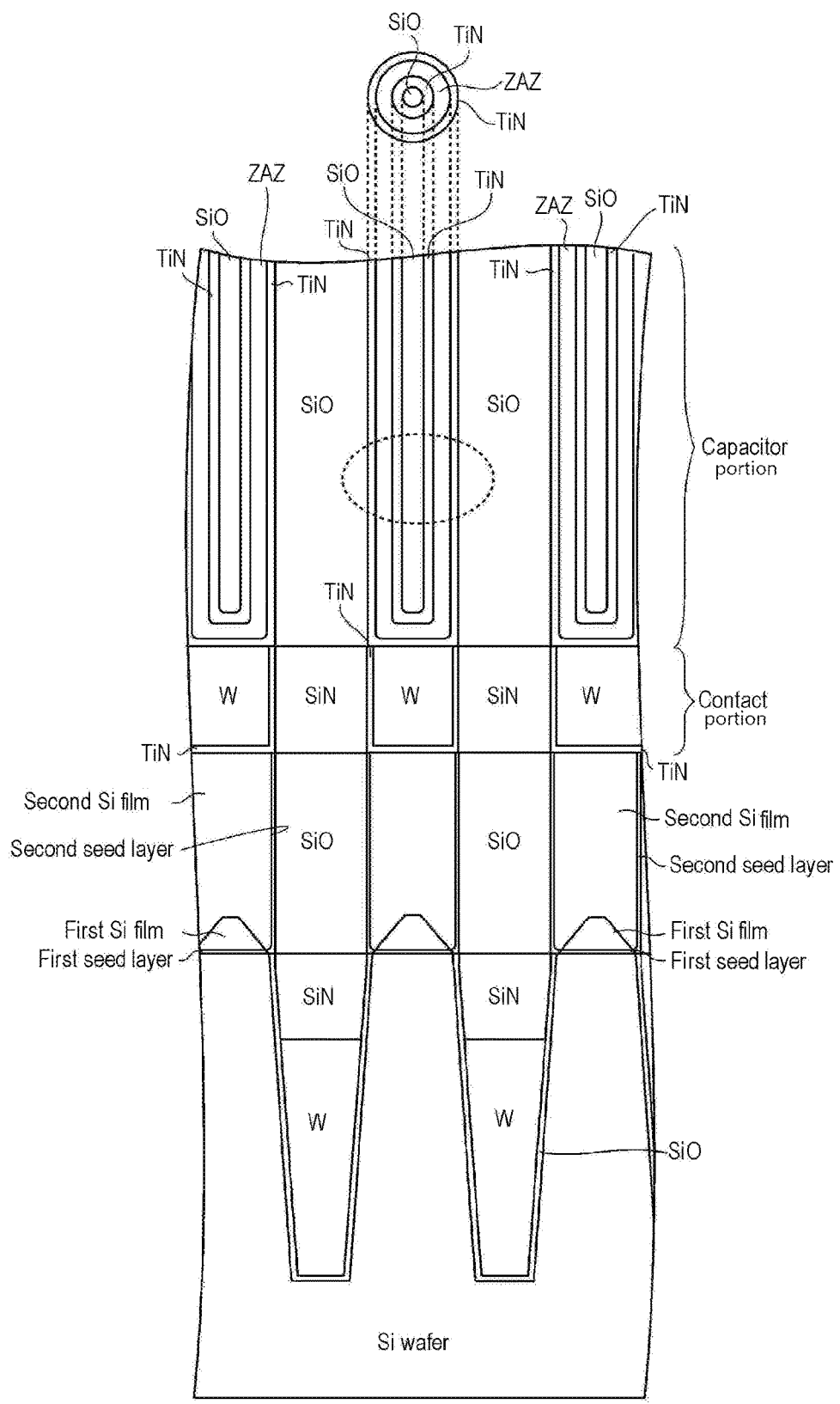
FIG. 9 is a view illustrating a cross-sectional structure of a major part of a DRAM.

As illustrated in FIG. 9, a trench is formed in a surface of a wafer made of a single crystal Si. A liner film such as an SiO film or the like is formed on a surface of the trench. The SiO film may be formed by, for example, a CVD method or a thermal oxidation process. A tungsten (W) film for a word line and an SiN film, which are laminated one above another, are embedded in the trench having the liner film formed thereon. The W film may be formed by, for example, a CVD method. The SiN film may be formed by, for example, a CVD method. An insulating film such as an SiO film or the like is formed on the SiN film formed in the trench. The SiO film may be formed by, for example, a CVD method.

A first seed layer configured by a homo-epitaxial Si layer doped with P is formed on an exposed portion of the surface of the wafer, namely on the single crystal Si. A second seed layer configured by an amorphous Si layer, a poly-Si layer, or a mixed crystal Si layer in which amorphous and poly are mixed with each other, which is doped with P, is formed on the SiO film. The first seed layer and the second seed layer may be formed by the methods of the embodiments or the modifications described above.

A first Si film configured by a homo-epitaxial Si film doped with P is formed on the first seed layer formed on the single crystal Si. A second Si film configured by an amorphous Si film, a polycrystalline Si film, or a mixed crystal Si film in which amorphous and poly are mixed with each other, which is doped with P, is formed on the second seed layer formed on the SiO film. That is to say, the interior of a concave portion defined by the SiO film and the single crystal Si adjacent each other is buried with the Si film. In addition, a laminate structure obtained by laminating the second Si film on the first Si film is formed on the single crystal Si. That is to say, the epitaxial Si film (the first Si film) is formed in an interface between the single crystal Si and the second Si film. The first Si film and the second Si film may be formed by the methods of the embodiments or the modifications described above. The first Si film and the second Si film act as contact plugs. The first seed layer and the second seed layer may be regarded as being included in a portion of the contact plug.

A contact portion is formed on the SiO film and the second Si film, and a capacitor portion is formed on the contact portion. A laminate structure including the capacitor portion and the contact portion is illustrated in a vertical cross-sectional view in a lower side of FIG. 9, and a horizontal cross-sectional view of a portion indicated by the broken line in the capacitor portion is illustrated in an upper side of FIG. 9. When forming a contact plug of the DRAM having such a structure, namely the first seed layer, the second seed layer, the first Si film, and the second Si film, the same effects as those of the embodiments or the modifications described above may be achieved using the methods of the embodiments or the modifications described above. That is to say, even when the methods of the embodiments or the modifications described above are applied to a manufacturing process of the DRAM, it is possible to drastically reduce a contact resistance, drastically improving electrical characteristics.

The embodiments or the modifications described above may be applied to a process of forming an Si film, which is performed as one of the manufacturing processes of a flash memory as a non-volatile semiconductor memory device (non-volatile memory). Hereinafter, a structure of a major part of a NAND type flash memory, which is one kind of a flash memory manufactured by applying the methods of the embodiments or the modifications described above, particularly a 3D NAND type flash memory (hereinafter sometimes referred to as "3DNAND"), will be described with reference to FIG. 10. The 3D NAND type flash memory may sometimes be simply referred to as a 3D flash memory (or a 3D non-volatile semiconductor memory device).

Furthermore, here, for the sake of convenience, some of films or structures constituting the 3DNAND will be described and descriptions of other films or structures will be omitted.

As illustrated in FIG. 10, a multilayer-laminated film (hereinafter, simply referred to as a "laminated film") obtained by alternately laminating a plurality of metal films such as an SiO film, a TiN film, a W film and the like is formed on a surface of a wafer made of a single crystal Si. Here, an example in which the lowermost layer and the uppermost layer are formed as the SiO films is illustrated. The metal films such as the TiN film, the W film and the like act as control gates. That is to say, the metal films such as the TiN film, the W film and the like acting as the control gates are formed between the SiO films vertically adjacent to each other. These films may be formed by, for example, a CVD method. In FIG. 10, for the sake of convenience, an example in which the lamination number is nine is illustrated, but the present disclosure is not limited thereto. For example, the lamination number may be 20 or more, specifically 30 or more, ultimately 40 or more.

A channel hole is formed on the laminated film. An insulating film as an ONO film configured by three layers, namely an SiO film/SiN film/SiO film, is formed in the channel hole. These films may be formed by, for example, a CVD method.

A portion of the ONO film making contact with the wafer has been removed. A first seed layer configured by a homo-epitaxial Si layer doped with P is formed on an exposed portion of the surface of the wafer within the channel hole, namely on a single crystal Si. A second seed layer configured by an amorphous Si layer, a poly-Si layer, or a mixed crystal Si layer in which amorphous and poly are mixed with each other, which is doped with P, is formed on the ONO film (accurately, on the SiO film constituting the ONO film). The first seed layer and the second seed layer may be formed by the methods of the embodiments or the modifications described above.

A first Si film configured by a homo-epitaxial Si film doped with P is formed on the first seed layer formed on the single crystal Si. A second Si film configured by an amorphous Si film, a poly-Si film or a mixed crystal Si film in which amorphous and poly are mixed with each other, which is doped with P, is formed on the second seed layer formed on the ONO film. The first Si film and the second Si film may be formed by the methods of the embodiments or the modifications described above. A film thickness of each of the first Si film and the second Si film may be set to become 10 nm or less, for example, to fall within a range of 3 to 10 nm, specifically 5 nm or less, for example, to fall within a range of 3 to 5 nm. The first Si film and the second Si film act as channels. The Si films (the first Si film and the second Si film) functioning as the channels are referred to as channel Si. Furthermore, the first seed layer and the second seed layer may be regarded as being included in a portion of the channel.

The remaining portion within the channel hole, namely the interior of the concave portion configured by the first Si film and the second Si film, is buried with an SiO film. The SiO film may be formed by, for example, a CVD method. The channel portion is configured in this manner.

A trench is formed in a multilayer laminated film obtained by alternately laminating a plurality of metal films such as an SiO film, a TiN film, a W film and the like. The trench is buried with the SiO film.

The SiO film is also formed in an upper portion of the control gate portion or in an upper portion of the channel portion. The SIO film may be formed by, for example, a CVD method. A contact hole is formed in an upper portion of the channel portion of the SiO film. A metal film acting as a contact is formed within the contact hole.

When forming the channel Si, namely the first seed layer, the second seed layer, the first Si film and the second Si film, of the 3DNAND having such a structure, the same effects as those of the methods of the embodiments or the modifications described above may be achieved using the methods of the embodiments or the modifications described above. That is to say, even when the methods of the embodiments or the modifications described above is applied to the manufacturing process of the 3DNAND, it is possible to drastically reduce a contact resistance between the Si wafer and the channel Si, drastically improving electrical characteristics.

Furthermore, by applying the methods of the embodiments or the modifications described above to the manufacturing process of the 3DNAND, it is possible to form flat and dense seed layers (the first seed layer and the second seed layer) and to form flat and dense Si films (the first Si film and the second Si film) even if they are thin. It is therefore possible to form the Si films as films without a pin hole (pin hole-free films). Thus, it becomes possible to prevent an underlying film of the Si film from being etched in a wet process using HF or the like, which is performed after the formation of the Si films. In addition, since the thin, flat and dense Si films can be formed, the second Si film can be thinned. This makes it possible to reduce a trap density of electric charges in a crystal grain boundary, increasing the mobility of electrons in the channel of the 3DNAND.

Recipes (programs describing process procedures and process conditions) used in the substrate process may be prepared individually according to process contents (the kind, composition ratio, quality, film thickness, process procedure and process condition of a film to be formed) and may be stored in the memory device 121c via a telecommunication line or the external memory device 123. Moreover, at the start of the substrate process, the CPU 121a may properly select an appropriate recipe from the recipes stored in the memory device 121c according to the contents of the substrate process. Thus, it is possible for a single substrate processing apparatus to form films of different kinds, composition ratios, qualities and thicknesses with enhanced reproducibility. In addition, it is possible to alleviate an operator's burden (e.g., a burden borne by an operator when inputting the process procedures and the process conditions) and to quickly start the substrate process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace.

Figure 7:
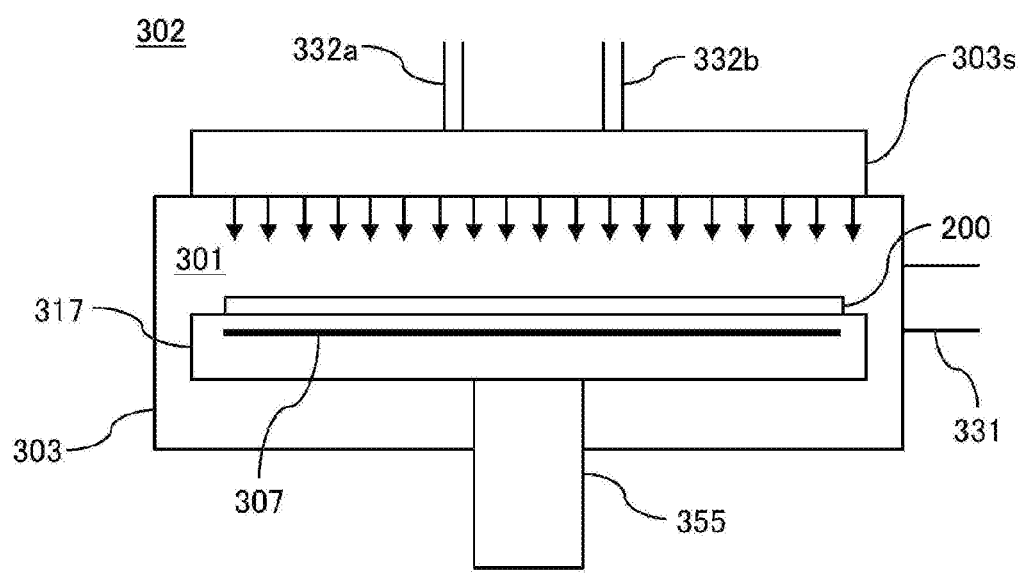
FIG. 7 is a schematic configuration view of a processing furnace of a substrate processing apparatus suitably used in another embodiment of the present disclosure, in which a portion of the processing furnace is shown in a vertical cross-sectional view.

The present disclosure may be suitably applied to, e.g., a case where a film is formed using a substrate processing apparatus provided with a processing furnace 302 illustrated in FIG. 7. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A gas supply system similar to the first supply system and the fourth supply system of the aforementioned embodiment is connected to the gas supply port 332a. A gas supply system similar to the second supply system and the third supply system of the aforementioned embodiment is connected to the gas supply port 332b. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. An exhaust port 331 configured to exhaust the interior of the process chamber 301 is installed in the process vessel 303. An exhaust system similar to the exhaust system of the aforementioned embodiment is connected to the exhaust port 331.

Figure 8:
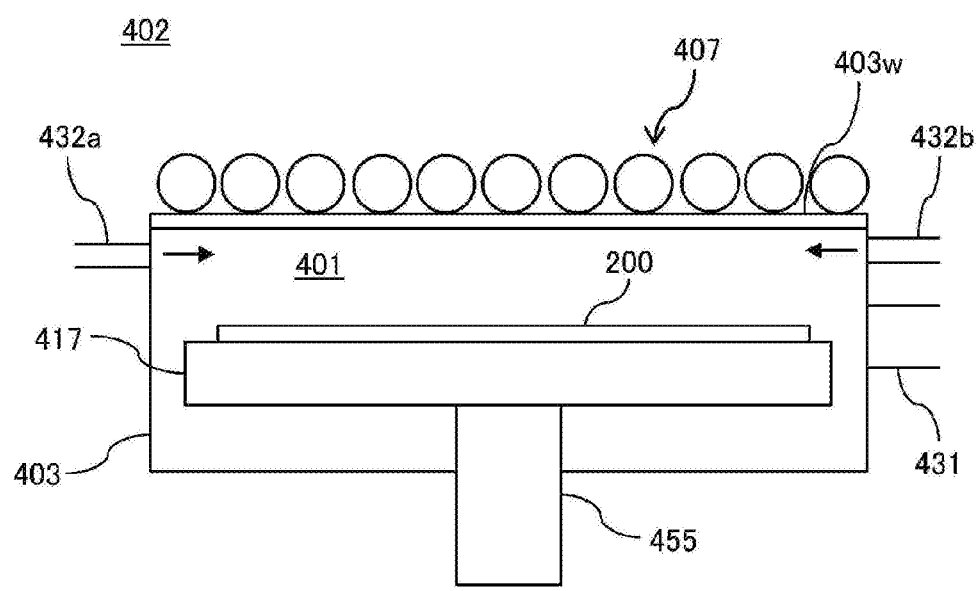
FIG. 8 is a schematic configuration view of a processing furnace of a substrate processing apparatus suitably used in another embodiment of the present disclosure, in which a portion of the processing furnace is shown in a vertical cross-sectional view.

In addition, the present disclosure may be suitably applied to, e.g., a case where a film is formed using a substrate processing apparatus provided with a processing furnace 402 illustrated in FIG. 8. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407 therethrough. Gas supply ports 432a and 432b are connected to the process vessel 403. A supply system similar to the first supply system and the fourth system of the aforementioned embodiment is connected to the gas supply port 432a. A supply system similar to the second supply system and the third supply system of the aforementioned embodiment is connected to the gas supply port 432b. The gas supply ports 432a and 432b are respectively installed at the lateral side of end portions of the wafers 200 carried into the process chamber 401, namely in such positions as not to face the surfaces of the wafers 200 carried into the process chamber 401. An exhaust port 431 configured to exhaust the interior of the process chamber 401 is installed in the process vessel 403. An exhaust system similar to the exhaust system of the aforementioned embodiment is connected to the exhaust port 431.

Even in the case of using such a substrate processing apparatus, it is possible to form a film under the same sequences and the process conditions as those of the embodiments or the modifications described above and to obtain the same effects as those of the embodiments or the modifications described above.

In the embodiments or the modifications described above, there has been described an example in which a film containing Si as a main element is formed on the substrate, but the present disclosure is not limited thereto. That is to say, the present disclosure may be suitably applied to a case where a film containing a semi-metal element such as germanium (Ge), B or the like, other than Si, as a main element is formed on the substrate. Furthermore, the present disclosure may be suitably applied to a case where a film containing, as a main element, a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like is formed on the substrate.

The embodiments and modifications described above may be appropriately combined with one another. The process procedures and process conditions used at this time may be similar to, for example, the process procedures and process conditions of the aforementioned embodiments.

According to the present disclosure in some embodiments, it is possible to improve a quality of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or the modifications as would fall within the scope and spirit of the disclosures.

What is claimed is:

1. A method of manufacturing a semiconductor device, comprising:
    forming a seed layer doped with a dopant on a substrate by performing a cycle a predetermined number of times, the cycle including:
        supplying a halogen-based first process gas to the substrate,
        supplying a non-halogen-based second process gas to the substrate, and
        supplying a dopant gas to the substrate; and
    supplying a third process gas to the substrate to form a film on the seed layer,
    wherein the act of forming the seed layer includes a period during which at least one of the act of supplying the first process gas and the act of supplying the second process gas, and the act of supplying the dopant gas are simultaneously performed, and
    wherein a pressure of a space where the substrate is present in the act of supplying the first process gas is set to be greater than a pressure of a space where the substrate is present in each of the act of supplying the second process gas and the act of supplying the dopant gas, and a pressure of a space where the substrate is present in each of the act of supplying the second process gas and the act of supplying the dopant gas is set to be greater than a pressure of a space where the substrate is present in the act of forming the film.

2. The method of claim 1, wherein the act of forming the seed layer includes:
    forming a first seed layer not doped with a dopant on the substrate by performing a first set a predetermined number of times, the first set including:
        the act of supplying the first process gas, and
        the act of supplying the second process gas; and
    forming a second seed layer doped with a dopant on the first seed layer by performing a second set a predetermined number of times, the second set including:
        the act of supplying the first process gas,
        the act of supplying the second process gas, and
        the act of supplying the dopant gas.

3. The method of claim 1, wherein the act of forming the film includes supplying a dopant gas to the substrate, and the film is a film doped with a dopant.

4. The method of claim 3, wherein a concentration of the dopant in the seed layer is set to be different from a concentration of the dopant in the film.

5. The method of claim 3, wherein a concentration of the dopant in the seed layer is set to be smaller than a concentration of the dopant in the film.

6. The method of claim 3, wherein a supply flow rate of the dopant gas in the act of forming the seed layer is set to be smaller than a supply flow rate of the dopant gas in the act of forming the film.

7. The method of claim 1, wherein a pressure of a space where the substrate is present in the act of forming the seed layer is set to be greater than a pressure of a space where the substrate is present in the act of forming the film.

8. The method of claim 1, wherein the dopant gas includes at least one selected from a group consisting of boron, aluminum, gallium, phosphorus, arsenic, and antimony.

9. The method of claim 1, wherein each of the first process gas, the second process gas, and the third process gas contains the same element constituting the film.

* * * * *